(12) United States Patent
Keller et al.

(10) Patent No.: US 7,429,410 B2
(45) Date of Patent: Sep. 30, 2008

(54) DIFFUSER GRAVITY SUPPORT

(75) Inventors: Ernst Keller, Sunnyvale, CA (US); John M. White, Hayward, CA (US); Robin L. Tiner, Santa Cruz, CA (US); Jiri Kucera, Cupertino, CA (US); Soo Young Choi, Fremont, CA (US); Beom Soo Park, San Jose, CA (US); Michael Starr, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 11/188,922

(22) Filed: Jul. 25, 2005

(65) Prior Publication Data

US 2006/0060138 A1 Mar. 23, 2006

Related U.S. Application Data

(60) Provisional application No. 60/653,617, filed on Feb. 16, 2005, provisional application No. 60/611,512, filed on Sep. 20, 2004.

(51) Int. Cl.
*H05H 1/24* (2006.01)
(52) U.S. Cl. ..................... 427/578
(58) Field of Classification Search ........... 427/569; 118/715
See application file for complete search history.

(56) References Cited

U.S. PATENT DOCUMENTS 3,830,194 A 8/1974 Benzing et al.
3,854,443 A 12/1974 Baerg
4,474,358 A 10/1984 Bennett
4,491,520 A 1/1985 Jaye
4,522,149 A 6/1985 Garbis et al.

(Continued)

FOREIGN PATENT DOCUMENTS

CN 1501762 6/2004

(Continued)

OTHER PUBLICATIONS

Chinese Office Action dated Jun. 15, 2007 for Chinese Application No. 200410082199.3.

(Continued)

*Primary Examiner*—Timothy Meeks
*Assistant Examiner*—Elizabeth A Burkhart
(74) *Attorney, Agent, or Firm*—Patterson & Sheridan LLP

(57) ABSTRACT

An apparatus and method for supporting a substantial center portion of a gas distribution plate is disclosed. At least one support member is capable of engaging and disengaging the diffuser with a mating connection without prohibiting flow of a gas or gasses through the diffuser and is designed to provide vertical suspension to a diffuser that is supported at its perimeter, or capable of supporting the diffuser without a perimeter support. In one aspect, the at least one support member is a portion of a gas delivery conduit and in another embodiment is a plurality of support members separated from the gas delivery conduit. The at least one support member is capable of translating vertical lift, or vertical compression to a center area of the diffuser. A method and apparatus for controlling gas flow from the gas delivery conduit to the gas distribution plate is also disclosed.

15 Claims, 21 Drawing Sheets

U.S. PATENT DOCUMENTS

| | | |
|---|---|---|
| 4,563,367 A | 1/1986 | Sherman |
| 4,726,924 A | 2/1988 | Mittelstadt |
| 4,792,378 A | 12/1988 | Rose et al. |
| 4,799,418 A | 1/1989 | Takahashi et al. |
| 4,809,421 A | 3/1989 | Justice |
| 4,854,263 A | 8/1989 | Chang et al. |
| 4,927,991 A | 5/1990 | Wendt et al. |
| 4,993,358 A | 2/1991 | Mahawili |
| 5,000,113 A | 3/1991 | Wang et al. |
| 5,044,943 A | 9/1991 | Bowman et al. |
| 5,124,635 A | 6/1992 | Henley |
| 5,152,504 A | 10/1992 | Nixon et al. |
| 5,173,580 A | 12/1992 | Levin et al. |
| 5,268,034 A | 12/1993 | Vukelic |
| 5,332,443 A | 7/1994 | Chew et al. |
| 5,399,387 A | 3/1995 | Law et al. |
| 5,421,893 A | 6/1995 | Perlov |
| 5,439,524 A | 8/1995 | Cain et al. |
| 5,500,256 A | 3/1996 | Watabe |
| 5,503,809 A | 4/1996 | Coate et al. |
| 5,567,243 A | 10/1996 | Foster et al. |
| 5,582,866 A | 12/1996 | White |
| 5,611,865 A | 3/1997 | White et al. |
| 5,614,026 A | 3/1997 | Williams |
| 5,614,055 A | 3/1997 | Fairbairn et al. |
| 5,628,829 A | 5/1997 | Foster et al. |
| 5,628,869 A | 5/1997 | Mallon |
| 5,647,911 A | 7/1997 | Vanell et al. |
| 5,714,408 A | 2/1998 | Ichikawa et al. |
| 5,766,364 A | 6/1998 | Ishida et al. |
| 5,819,434 A | 10/1998 | Herchen et al. |
| 5,820,686 A | 10/1998 | Moore |
| 5,844,205 A | 12/1998 | White et al. |
| 5,846,332 A | 12/1998 | Zhao et al. |
| 5,876,838 A | 3/1999 | Mallon |
| 5,882,411 A | 3/1999 | Zhao et al. |
| 5,928,732 A | 7/1999 | Law et al. |
| 5,950,925 A | 9/1999 | Fukunaga et al. |
| 5,968,276 A | 10/1999 | Lei et al. |
| 5,990,016 A | 11/1999 | Kim et al. |
| 5,994,678 A | 11/1999 | Zhao et al. |
| 5,997,649 A | 12/1999 | Hillman |
| 6,024,799 A | 2/2000 | Chen et al. |
| 6,030,508 A | 2/2000 | Yang et al. |
| 6,040,022 A | 3/2000 | Chang et al. |
| 6,041,733 A | 3/2000 | Kim et al. |
| 6,050,506 A | 4/2000 | Guo et al. |
| 6,079,356 A | 6/2000 | Umotoy et al. |
| 6,113,700 A | 9/2000 | Choi |
| 6,123,775 A | 9/2000 | Hao et al. |
| 6,140,255 A | 10/2000 | Ngo et al. |
| 6,148,765 A | 11/2000 | Lilleland et al. |
| 6,149,365 A | 11/2000 | White et al. |
| 6,150,283 A | 11/2000 | Ishiguro et al. |
| 6,170,432 B1 | 1/2001 | Szapucki et al. |
| 6,176,668 B1 | 1/2001 | Kurita et al. |
| 6,182,603 B1 | 2/2001 | Shang et al. |
| 6,197,151 B1 | 3/2001 | Kaji et al. |
| 6,203,622 B1 | 3/2001 | Halpin et al. |
| 6,228,438 B1 | 5/2001 | Schmitt |
| 6,232,218 B1 | 5/2001 | Cathey et al. |
| 6,254,742 B1 | 7/2001 | Hanson et al. |
| 6,281,469 B1 | 8/2001 | Perrin et al. |
| 6,302,057 B1 | 10/2001 | Leusink et al. |
| 6,338,874 B1 | 1/2002 | Law et al. |
| 6,344,420 B1 | 2/2002 | Miyajima et al. |
| 6,364,949 B1 | 4/2002 | Or et al. |
| 6,371,712 B1 | 4/2002 | White et al. |
| 6,383,573 B1 | 5/2002 | Beck et al. |
| 6,444,040 B1 | 9/2002 | Herchen et al. |
| 6,447,980 B1 | 9/2002 | Rahman et al. |
| 6,454,855 B1 | 9/2002 | Von Kanel et al. |
| 6,477,980 B1 | 11/2002 | White et al. |
| 6,502,530 B1 | 1/2003 | Turlot et al. |
| 6,527,908 B2 | 3/2003 | Kanetsuki et al. |
| 6,548,112 B1 | 4/2003 | Hillman et al. |
| 6,556,536 B1 | 4/2003 | Reynolds et al. |
| 6,566,186 B1 | 5/2003 | Allman et al. |
| 6,593,548 B2 | 7/2003 | Matsumura et al. |
| 6,596,576 B2 | 7/2003 | Fu et al. |
| 6,599,367 B1 | 7/2003 | Nakatsuka |
| 6,616,766 B2 | 9/2003 | Duham |
| 6,619,131 B2 | 9/2003 | Walchli et al. |
| 6,626,988 B1 | 9/2003 | Schmalstieg et al. |
| 6,626,998 B1 | 9/2003 | Dunham |
| 6,631,692 B1 | 10/2003 | Matsuki et al. |
| 6,663,025 B1 | 12/2003 | Halsey et al. |
| 6,664,202 B2 | 12/2003 | Tang et al. |
| 6,682,630 B1 | 1/2004 | Colpo et al. |
| 6,683,216 B1 | 1/2004 | Zoeller et al. |
| 6,740,367 B2 | 5/2004 | Matsuki et al. |
| 6,756,324 B1 | 6/2004 | Gates |
| 6,772,827 B2 | 8/2004 | Keller et al. |
| 6,793,733 B2 | 9/2004 | Janakiraman et al. |
| 6,814,838 B2 | 11/2004 | Weichart |
| 6,821,347 B2 | 11/2004 | Carpenter et al. |
| 6,852,168 B2 | 2/2005 | Park |
| 6,873,764 B2 | 3/2005 | Maisenholder et al. |
| 6,881,684 B2 | 4/2005 | Aota et al. |
| 6,916,407 B2 | 7/2005 | Voser et al. |
| 6,918,352 B2 | 7/2005 | Von Kanel et al. |
| 6,924,241 B2 | 8/2005 | Lee et al. |
| 6,942,753 B2 | 9/2005 | Choi et al. |
| 6,961,490 B2 | 11/2005 | Maisenholder et al. |
| 7,125,758 B2 | 10/2006 | Choi et al. |
| 2001/0023742 A1 | 9/2001 | Schmitt |
| 2001/0029892 A1 | 10/2001 | Cook et al. |
| 2002/0006478 A1 | 1/2002 | Yuda et al. |
| 2002/0011215 A1 | 1/2002 | Tei et al. |
| 2002/0129769 A1 | 9/2002 | Kim et al. |
| 2002/0146879 A1 | 10/2002 | Fu et al. |
| 2002/0174950 A1 | 11/2002 | Park |
| 2002/0189545 A1 | 12/2002 | Matsumura et al. |
| 2003/0089314 A1* | 5/2003 | Matsuki et al. ............. 118/715 |
| 2003/0143471 A1* | 7/2003 | Won et al. .................... 428/448 |
| 2003/0170388 A1 | 9/2003 | Shinriki et al. |
| 2003/0199175 A1 | 10/2003 | Tang et al. |
| 2003/0209323 A1 | 11/2003 | Yokogaki |
| 2004/0003777 A1 | 1/2004 | Carpenter |
| 2004/0043637 A1 | 3/2004 | Aota et al. |
| 2004/0064407 A1 | 4/2004 | Kight et al. |
| 2004/0129211 A1 | 7/2004 | Bonigan et al. |
| 2004/0145383 A1 | 7/2004 | Brunner |
| 2004/0228141 A1 | 11/2004 | Hay et al. |
| 2004/0250955 A1 | 12/2004 | Blonigan et al. |
| 2005/0000430 A1 | 1/2005 | Jang et al. |
| 2005/0066898 A1 | 3/2005 | Schmitt et al. |
| 2005/0133160 A1 | 6/2005 | Kennedy |
| 2005/0133161 A1 | 6/2005 | Carpenter et al. |
| 2005/0183827 A1 | 8/2005 | White et al. |
| 2005/0196254 A1 | 9/2005 | Kim et al. |
| 2005/0199182 A1 | 9/2005 | Masuda et al. |
| 2005/0223986 A1 | 10/2005 | Choi et al. |
| 2005/0255257 A1 | 11/2005 | Choi et al. |
| 2006/0005771 A1 | 1/2006 | White et al. |
| 2006/0005926 A1 | 1/2006 | Kang |
| 2006/0054280 A1 | 3/2006 | Jang |
| 2006/0060138 A1 | 3/2006 | Keller et al. |
| 2006/0130764 A1 | 6/2006 | Quan |
| 2006/0236934 A1 | 10/2006 | Choi et al. |

FOREIGN PATENT DOCUMENTS

| | | | |
|---|---|---|---|
| EP | | 0 843 348 A2 | 5/1998 |

| | | |
|---|---|---|
| EP | 0985742 A2 | 3/2000 |
| EP | 1 118 693 | 7/2001 |
| EP | 1 168 427 | 1/2002 |
| EP | 1167570 | 1/2002 |
| EP | 1167570 A1 | 1/2002 |
| EP | 1168427 | 1/2002 |
| EP | 1 321 538 | 6/2003 |
| EP | 1 386 981 A1 | 2/2004 |
| JP | 60-025235 | 2/1985 |
| JP | 01/004481 A | 6/1987 |
| JP | 63-187619 | 8/1988 |
| JP | 2001-004481 | 1/1989 |
| JP | 2001-149964 | 6/1989 |
| JP | 01149964 A2 | 6/1989 |
| JP | 03-122281 | 5/1991 |
| JP | 08-055802 | 2/1996 |
| JP | 2002-064084 | 2/2002 |
| JP | 2005086208 A | 3/2005 |
| JP | 2001-164371 | 5/2006 |
| JP | 2006-121057 | 5/2006 |
| KR | 1998-0032712 | 9/1998 |
| KR | 10-2001-0044503 | 6/2001 |
| KR | 10-2003-0009853 | 2/2003 |
| KR | 10-2003-0042920 | 6/2003 |
| KR | 10-2003-0066118 | 8/2003 |
| KR | 10-2003-0077803 | 10/2003 |
| KR | 10-2004-0019109 | 1/2004 |
| KR | 2004-0011910 | 2/2004 |
| KR | 10-2004-0066005 | 7/2004 |
| KR | 10-2004-0100196 | 12/2004 |
| KR | 10-2004-0104197 | 12/2004 |
| KR | 10-2005-0015931 | 2/2005 |
| KR | 10-2005-0076070 | 7/2005 |
| KR | 10-2005-0080105 | 8/2005 |
| KR | 10-2006-0004505 | 1/2006 |
| KR | 2006-0045322 | 5/2006 |
| TW | 301465 | 11/2002 |
| TW | 239225 | 9/2005 |
| TW | 252223 | 4/2006 |
| TW | 279997 | 4/2007 |
| WO | WO 95/33866 | 12/1995 |
| WO | WO 99/25012 | 5/1999 |
| WO | WO 99/25895 | 5/1999 |
| WO | WO01/83852 A1 | 11/2001 |
| WO | WO 03-015481 | 2/2003 |
| WO | 03078681 A1 | 9/2003 |
| WO | WO 2004/064407 | 7/2004 |

OTHER PUBLICATIONS

European Office Action dated Dec. 20, 2007 for European Patent Application No. 05000831.7.
European Partial Search Report dated May 23, 2006 for European Application No. 05021902.1.
European Search Report dated Feb. 16, 2006 for European Application No. 05000831.7-2122.
Extended European Search Report dated Aug. 24, 2006 for European Application No. 05021902.1.
International Preliminary Report on Patentability dated Jan. 25, 2007 for International Application No. PCT/US2005/24165.
International Search Report and Written Opinion dated Jul. 19, 2006 for International Application No. PCT/US2005/24165.
International Search Report mailed Aug. 11, 2005 for International Application No. PCT/US05/12832.
Korean Notice of Preliminary Rejection dated May 7, 2007 for Korean Application No. 10-2004-0108843.
Korean Office Action dated Nov. 22, 2007 for Korean Patent Application No. 10-2007-0079040.
Korean Office Action dated Nov. 22, 2007 for Korean Patent Application No. 10-2007-0079040.
Korean Office Action dated Oct. 31, 2006 for Korean Application No. 10-2005-87454.
A. Sazonov, et al. "Low Temperature a-Si:H TFT on Plastic Films: Materials and Fabrication Aspects," Proc. 23rd International Conference on Microelectronics (MIEL 2002), vol. 2, Nis, Yugoslavia (May 2002).
Anders, et al. "Characterization of a Low-Energy Constricted-Plasma Source" Ernest Orlando Lawrence Berkeley National Laboratory & Institute of Physics, Germany (Aug. 1997) pp. 1-11.
Anders, et al. "Working Principle of the Hollow-Anode Plasma Source" Lawrence Berkeley National Laboratory, USB pp. 1-10.
D.B. Thomasson, et al. "High Mobility Tri-Layer a-Si:H Thin Film Transistors with Ultra-Thin Active Laer," (1997) Society of Information Display International Symposium Digest of Technical Papers, vol. 28, pp. 176-179.
L. Bardos, et al. "Thin Film Processing by Radio Fequency Hollow Cathodes," Surface and Coatings Techonolgy (1997), pp. 723-728.
L. Kyung-ha, "A Study on Laser Annealed Polycrystalline Silicon Thin Film Transistors (TFT's) with SiNx Gate Insulator," Kyung Hee University, Ch. 2 & 4 (1998).
Lee, et al. "High Density Hollow Cathode Plasma Etching for Field Emission Display Applications" Journal of Information Display vol. 2, No. 4 (2002) pp. 1-7.
M.A. Lieberman, et al. "Standing Wave and Skin Effects in Large-Area, High-Frequency Capacitive Discharges" Plasma Sources Sci. Technology, vol. 11, pp. 283-293 (2002).
S.K. Kim, et al. "A Novel Self-Aligned Coplanar Amorphous Silicon Thin Film Transistor," ISSN0098-0966X/98/2901 (1998).
Y. Park, "Bulk and Interface Properties of Low-Temperature Silicon Nitride Films Deposited by Remote Plasma Enhanced Chemical Vapor Deposition," Journal of Material Science: Materials in Electronics, vol. 12, pp. 515-522 (2001).
Yue Kuo, "Plasma Enhanced Chemical Vapor Deposition Silicon Nitride as a Gate Dielectric Film for Amorhous Silicon Thin Film Transistors—A Critical Review" Vacuum, vol. 51, No. 4, pp. 741-745, Elsevier Science Ltd. (1998).
"13.56 MHz Hollow Cathode Plasma Source HCD-P 100" Plasma Consult Germany—Technical Note.
"13.56 MHz Hollow Cathode Plasma Source HCD-P 300" Plasma Consult Germany—Technical Note.
Partial European Search Report dated May 23, 2006 for EP 05021902.1.
Taiwan Search Report for Application No. TW94130602, Dated Apr. 5, 2007.
Extended European Search Report for EP 05021902.1, Dated Aug. 30, 2006.
U.S. Appl. No. 10/889,683, filed Jul. 12, 2004.
U.S. Appl. No. 11/173,210, filed Jul. 1, 2005.
Chinese Office Action dated Jul. 27, 2007 for Chinese Application No. 200510106396.9.

* cited by examiner

DIFFUSER GRAVITY SUPPORT

CROSS-REFERENCE TO RELATED APPLICATIONS

This application claims priority to U.S. Provisional Application No. 60/611,512, filed Sep. 20, 2004, and U.S. Provisional Application No. 60/653,617, filed Feb. 16, 2005, both applications incorporated by reference herein.

BACKGROUND OF THE INVENTION

1. Field of the Invention

Embodiments of the present invention generally relate to supplying a gas or gasses to a plasma chamber. More specifically, the invention relates to supporting a gas distribution plate within the chamber.

2. Description of the Related Art

Flat panel displays employ an active matrix of electronic devices, such as insulators, conductors, and thin film transistors (TFT's) to produce flat screens used in a variety of devices such as television monitors, personal digital assistants (PDA's), and computer screens. Generally, these flat panel displays are made of two thin panels of glass, a polymeric material, or other suitable substrate material. Layers of a liquid crystal material or a matrix of metallic contacts, a semiconductor active layer, and a dielectric layer are deposited through sequential steps and sandwiched between the two thin panels which are coupled together to form a large area substrate having at least one flat panel display located thereon. At least one of the panels will include a conductive film that will be coupled to a power supply which will change the orientation of the crystal material and create a patterned display on the screen face.

These processes typically require the large area substrate to undergo a plurality of sequential processing steps that deposit the active matrix material on the substrate. Chemical vapor deposition (CVD) and plasma enhanced chemical vapor deposition (PECVD) are some of the well known processes for this deposition. These known processes require the large area substrate be subjected to temperatures on the order of 300° C. to 400° C. or higher, and maintained in a fixed position relative to a gas distribution plate, or diffuser, during deposition to ensure uniformity in the deposited layers. The diffuser generally defines an area that is equal to or greater than the area of the substrate. If the diffuser is somehow warped during deposition, the process may not produce uniform deposition, which may result in an unusable flat panel display.

Flat panel displays have increased dramatically in size over recent years due to market acceptance of this technology. Previous generation large area substrates had sizes of about 500 mm by 650 mm and have increased in size to about 1800 mm by about 2200 mm or larger. This increase in size has brought an increase in diffuser size so that the substrate may be processed completely. The larger diffuser size has presented new challenges to design a diffuser that will resist sag when exposed to high temperatures during deposition.

The diffuser is generally a plate supported in a spaced-apart relation above the large area substrate with a plurality of openings adapted to disperse a process gas or gasses and typically has substantially the same area as the to-be-processed substrate. Diffusers are commonly made of aluminum and are subject to expansion and contraction while enduring the CVD or PECVD processes and are commonly supported around the edges to control spacing between the diffuser and the substrate. However, this edge support scheme does not provide any support for the center portion, which can tend to sag or creep over time, due to the forces of gravity aggravated by high processing temperatures during the CVD or PECVD processes.

SUMMARY OF THE INVENTION

The invention generally relates to a method and apparatus for supporting a gas distribution plate, or diffuser, in a plasma chamber. In one embodiment, the diffuser is suspended by at least one interior or centrally located support member coupled to the gas distribution plate and a wall of the chamber. The invention is advantageous to avoid distortion of the diffuser in response to gravitational, and thermal or pressure induced forces acting on the diffuser while enduring the high temperatures created during plasma-enhanced chemical vapor deposition. The at least one support member is coupled between the diffuser and backing plate within the chamber and is capable of adjusting the planar orientation of the diffuser. The at least one support member is configured to adjust the diffuser profile pre or post evacuation of the chamber. In another embodiment, the at least one support member facilitates adjustment of the diffuser profile by adjustment of a plurality of screws coupled to the at least one support member. The gravitational support may be attached to the diffuser without compromising flow of the gas or gasses through the diffuser.

In one embodiment, the at least one support member is a gravitational support. The gravitational support includes a gas inlet and provides gas flow from the gas inlet to a plurality of orifices in the diffuser plate while also providing vertical support to the diffuser. The gravitational support is also capable of disengagement from the diffuser via a mating mechanism. In another embodiment, an orifice ring is configured to couple to the gravitational support and provide a gas flow adjustment aspect to the diffuser.

In another embodiment, a gas distribution plate is supported in a chamber by a first plate within the chamber, the first plate having a center area with at least one aperture formed therethrough. Below the first plate is a second plate, such as a gas distribution plate, that has at least one mating portion which vertically aligns with the at least one aperture in the first plate. At least one threaded support is adapted to engage the at least one mating portion, thereby supporting the gas distribution plate from a center area of the gas distribution plate. The at least one threaded support is coupled between the diffuser and backing plate. The backing plate is relatively thicker in cross-section than the diffuser, thus providing a substantially static support. The diffuser is more malleable relative the backing plate due to relative thickness and the perforations in the diffuser, which allows adjustment of the diffuser profile by adjustment of the at least one threaded support.

In another embodiment, a method of modifying the horizontal profile of a diffuser within a plasma chamber is described. The method comprises supporting a diffuser having a mating mechanism in a center area of the diffuser, engaging a support member to the mating portion, and adjusting the support member to modify the planarity of the diffuser. In one aspect, the method allows adjustment to be made before or after vacuum has been applied to the chamber. In one embodiment, the adjusting comprises modifying the horizontal profile of the diffuser to have at least one of a planar horizontal profile, a concave horizontal profile, or a convex horizontal profile.

In another embodiment, the at least one support member is a pivotal support. The pivotal support includes a ball stud detachably coupled to an upper pivotal member. The upper pivotal member is coupled to a backing plat within the chamber and the ball stud is adapted to detachably couple to the diffuser. The ball stud has a threaded portion that extends through the upper pivotal member and provides adjustment to the horizontal profile of the diffuser by at least one nut coupled to the threaded portion.

In another embodiment, a method of depositing a thin film on a substrate is described. The method comprises the steps of placing a substrate on a substrate support in a process chamber below a gas distribution plate, the gas distribution plate having a horizontal profile that is adjustable, flowing a process gas through a plurality of openings disposed in the gas distribution plate, forming a plasma between the gas distribution plate and the substrate, and depositing a thin film on the substrate. The method may further comprise heating the process chamber to a temperature of about 350° C. to about 450° C. In one embodiment, the horizontal profile of the gas distribution plate exhibits a concave shape. In another embodiment, the thin film is amorphous silicon. In another embodiment, the horizontal profile is adjusted using at least one support member and in another embodiment, a plurality of support members are used to adjust the horizontal profile.

In another embodiment, a method of adjusting the horizontal profile of a gas distribution plate is described comprising the steps of providing a gas distribution plate having a planar perimeter and center area, adjusting at least one support member coupled to the center area, and forming a horizontal profile in the center area that is at least one of planar, concave, or convex relative to the planar perimeter. In one embodiment, the adjusting is performed under vacuum conditions.

In another embodiment, a method of adjusting the horizontal profile of a gas distribution plate is described comprising the steps of providing a process chamber having a gas distribution plate between a backing plate and a substrate support, gauging the distance between the substrate support and the gas distribution plate, adjusting at least one support member coupled to the gas distribution plate and the backing plate, and forming a horizontal profile of the gas distribution plate that is at least one of planar, concave, or convex relative to the substrate support. In one embodiment, the adjusting comprises rotating the at least one support member. In another embodiment, the adjustment may be performed while the process chamber is under vacuum. In another embodiment, the at least one support member is adapted to provide a process gas to the gas distribution plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
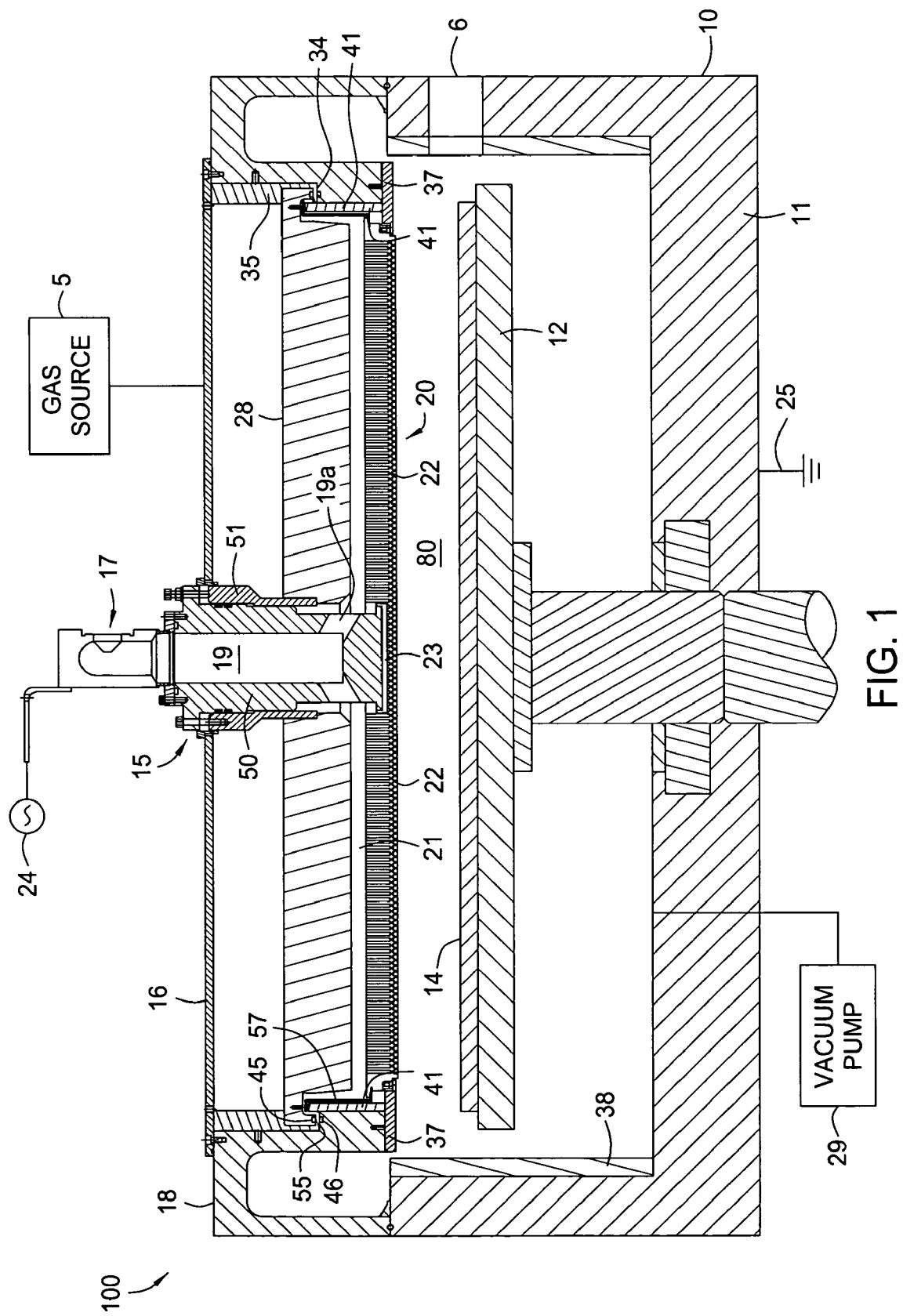
FIG. 1 is a side view of a plasma chamber.

Embodiments of the present invention generally provide an apparatus and method for supporting a gas distribution plate in a processing chamber. In one embodiment, at least one support member is configured to support the gas distribution plate and facilitates resistance to center sag or bowing caused by gravitational forces and high processing temperatures, thereby maintaining a desired horizontal profile in the gas distribution plate. The desired horizontal profile may be at least one of a level horizontal profile, a convex horizontal profile, or a concave horizontal profile. The horizontal profile or orientation of a gas distribution plate or diffuser as used herein refers to a cross section of the gas distribution plate as shown in the applicable Figures. In all embodiments, the gas distribution plate has at least one support member coupled to a center area of the gas distribution plate, wherein, by adjusting the at least one support member, the center area is adjustable to present a gas distribution plate with a horizontal profile that is at least one of planar, concave, or convex. To prevent confusion, common reference numerals referring to similar elements in the Figures are duplicated, where possible.

FIG. 1 is a side view of a chamber 100 that is suitable for chemical vapor deposition (CVD) or plasma enhanced chemical vapor deposition (PECVD) processes for fabricating the circuitry of a flat panel display on a large area glass, polymer, or other suitable substrate. The chamber 100 is configured to form structures and devices on a large area substrate for use in the fabrication of liquid crystal displays (LCD's) or flat panel displays, or photovoltaic cells for solar cell arrays. The structures may be a plurality of back channel etch inverted staggered (bottom gate) thin film transistors which may comprise a plurality of sequential deposition and masking steps. Other structures may include p-n junctions to form diodes for photovoltaic cells.

The chamber 100 is configured to deposit a variety of materials on a large area substrate that includes conductive materials (e.g., ITO, $ZnO_2$, W, Al, Cu, Ag, Au, Ru or alloys thereof), dielectric materials (e.g., $SiO_2$, $SiO_xN_y$, $HfO_2$, $HfSiO_4$, $ZrO_2$, $ZrSiO_4$, $TiO_2$, $Ta_2O_5$, $Al_2O_3$, derivatives thereof or combinations thereof), semiconductive materials (e.g., Si, Ge, SiGe, dopants thereof or derivatives thereof), barrier materials (e.g., $SiN_x$, $SiO_xN_y$, Ti, $TiN_x$, $TiSi_xN_y$, Ta, $TaN_x$, $TaSi_xN_y$, or derivatives thereof) and adhesion/seed materials (e.g., Cu, Al, W, Ti, Ta, Ag, Au, Ru, alloys thereof and combinations thereof). Metal-containing compounds that may be deposited by the chamber 100 include metals, metal oxides, metal nitrides, metal silicides, or combinations thereof. For example, metal-containing compounds include tungsten, copper, aluminum, silver, gold, chromium, cadmium, tellurium, molybdenum, indium, tin, zinc, tantalum, titanium, hafnium, ruthenium, alloys thereof, or combinations thereof. Specific examples of conductive metal-containing compounds that are formed or deposited by the chamber 100 onto the large area substrates, such as gate electrodes and other conductive layers, include indium tin oxide, zinc oxide, tungsten, copper, aluminum, silver, derivatives thereof or combinations thereof. The chamber 100 is also configured to deposit dielectric materials and semiconductive materials in a polycrystalline, amorphous or epitaxial state. For example, dielectric materials and semiconductive materials may include silicon, germanium, carbon, oxides thereof, nitrides thereof, dopants thereof or combinations thereof. Specific examples of dielectric materials and semiconductive materials that are formed or deposited by the chamber 100 onto the large area substrates may include epitaxial silicon, polycrystalline silicon, amorphous silicon, silicon germanium, germanium, silicon dioxide, silicon oxynitride, silicon nitride, dopants thereof (e.g., B, P or As), derivatives thereof or combinations thereof. The chamber 100 is also configured to receive gases such as argon, hydrogen, nitrogen, helium, or combinations thereof, for use as a purge gas or a carrier gas (e.g.,Ar, $H_2$, $N_2$, He, derivatives thereof, or combinations thereof).One example of depositing amorphous silicon thin films on a large area substrate using the chamber 100 may be accomplished by using silane as the precursor gas in a hydrogen carrier gas.

Examples of various devices and methods of depositing thin films on a large area substrate using the chamber 100 may be found in U.S. patent application Ser. No. 11/173,210, filed Jul. 1, 2005, entitled, "Plasma Uniformity Control By Gas Diffuser Curvature," which is incorporated by reference herein to the extent the application is not inconsistent with this specification. Other examples of various devices that may be formed using the chamber 100 may be found in U.S. patent application Ser. No. 10/889,683, filed Jul. 12, 2004, entitled "Plasma Uniformity Control by Gas Diffuser Hole Design," and in U.S. patent application Ser. No. 10/829,016, filed Apr. 20, 2004, entitled "Controlling the Properties and Uniformity of a Silicon Nitride Film by Controlling the Film Forming Precursors," both applications are incorporated by reference herein to the extent the applications are not inconsistent with this specification.

The chamber 100 consists of a chamber sidewall 10, a bottom 11, a substrate support 12, such as a susceptor, which supports a large area substrate 14. The chamber 100 also has a port 6, such as a slit valve, that facilitates transfer of the large area substrate by selectively opening and closing. The chamber 100 also includes a lid having an exhaust channel 18 surrounding a gas inlet manifold that consists of a cover plate 16, a first plate, such as a backing plate 28, and a second plate, such as a gas distribution plate, for example, a diffuser 20. The diffuser 20 may be any substantially planar solid that is adapted to provide a plurality of passages for a process gas or gasses from a gas source 5 coupled to the chamber 100. The diffuser 20 is positioned above the substrate 14 and suspended vertically by at least one support member, which in this embodiment is a diffuser gravitational support 15. In this embodiment, the diffuser 20 is also supported from an upper lip 55 of the exhaust channel 18 by a flexible suspension 57. A flexible suspension is disclosed in detail by U.S. Pat. No. 6,477,980, which issued Nov. 12, 2002 with the title "Flexibly Suspended Gas Distribution Manifold for A Plasma Chamber" and is incorporated by reference herein to the extent the reference is not inconsistent with this specification. The flexible suspension 57 is adapted to support the diffuser 20 from its edges and to allow expansion and contraction of the diffuser 20. Other edge suspensions of the diffuser 20 may be used with the diffuser gravitational support 15, and the diffuser support 15 may be used without edge suspension. For example, the diffuser 20 may be supported at its perimeter with supports that are not flexible, or may be unsupported at the edge. The diffuser gravitational support 15 may be coupled to the gas source 5 which supplies a process gas to a gas block 17 mounted on the support 15. The gas block 17 is in communication with the diffuser 20 via a longitudinal bore 19, within the support 15, and supplies a process gas to a plurality of orifices 22 within the diffuser 20. An example of a diffuser that may be used in the chamber 100 is described in U.S. patent application Ser. No. 11/173,210, filed Jul. 1, 2005, entitled, "Plasma Uniformity Control By Gas Diffuser Curvature," which has been previously incorporated by reference.

The diffuser gravitational support 15 is a substantially symmetrical body that is coupled to the backing plate 28. The backing plate 28 is a substantially planar plate having a suitable bore through in a center area for receiving the diffuser gravitational support 15, and is supported on its perimeter by the exhaust channel 18. The backing plate 28 is sealed on its perimeter by suitable O-rings 45 and 46 at points where the plate 28 and the exhaust channel 18 join, which protect the interior of chamber 100 from ambient environment and prevent escape of process gasses. The diffuser gravitational support 15 extends upwardly from the backing plate 28, through a suitable bore in the cover 16. In this embodiment, the gravitational support 15, with the diffuser 20 attached, is adapted to remain substantially static in its position above the large area substrate 14 and substrate support 12, while the substrate support 12 is adapted to raise and lower the substrate 14 to and from a transfer and processing position.

In operation, process gases are flowed from the gas source 5 while the chamber 100 has been pumped down to a suitable pressure by a vacuum pump 29. One or more process gasses travel through the gas block 17, through the longitudinal bore 19, through angled bores 19a, and are deposited in a large plenum 21 created between backing plate 28 and diffuser 20, and a small plenum 23 within the diffuser 20. The one or more process gasses then travel from the large plenum 21 and the small plenum 23 through the plurality of orifices 22 within the diffuser 20 to create a processing region 80 in an area below the diffuser 20. In operation, the large area substrate 14 is raised to this processing region 80 and the plasma excited gas or gases are deposited thereon to form structures on the large area substrate 14. A plasma may be formed in the processing region 80 by a plasma source 24 coupled to the chamber 100. The plasma source 24 may be a direct current power source, a radio frequency (RF) power source, or a remote plasma source. The RF power source may be inductively or capacitively coupled to the chamber 100. A plasma may also be formed in the chamber 100 by other means, such as a thermally induced plasma. Although the plasma source 24 is shown coupled to the gravitational support 15 in this embodiment, the plasma source 24 may be coupled to other portions of the chamber 100.

The diffuser 20 is made of or coated with an electrically conductive material and is coupled to the plasma source 24 so that it may function as an electrode within the chamber 100 and the substrate support 12 may be connected to a ground 25 so it may function as an electrode in the chamber 100 as well. The materials chosen for the diffuser 20 may include steel, titanium, aluminum, or combinations thereof and the surfaces may be polished or anodized. The substrate support 12 may further be heated by an integral heater, such as heating coils or a resistive heater coupled to or disposed within the substrate support 12. The diffuser 20 may be made of one or more pieces joined together and adapted to deliver a process gas and is electrically insulated from the chamber exhaust channel 18 and the wall 10 by dielectric spacers 34, 35, 37, 38, and 41

Figure 2:
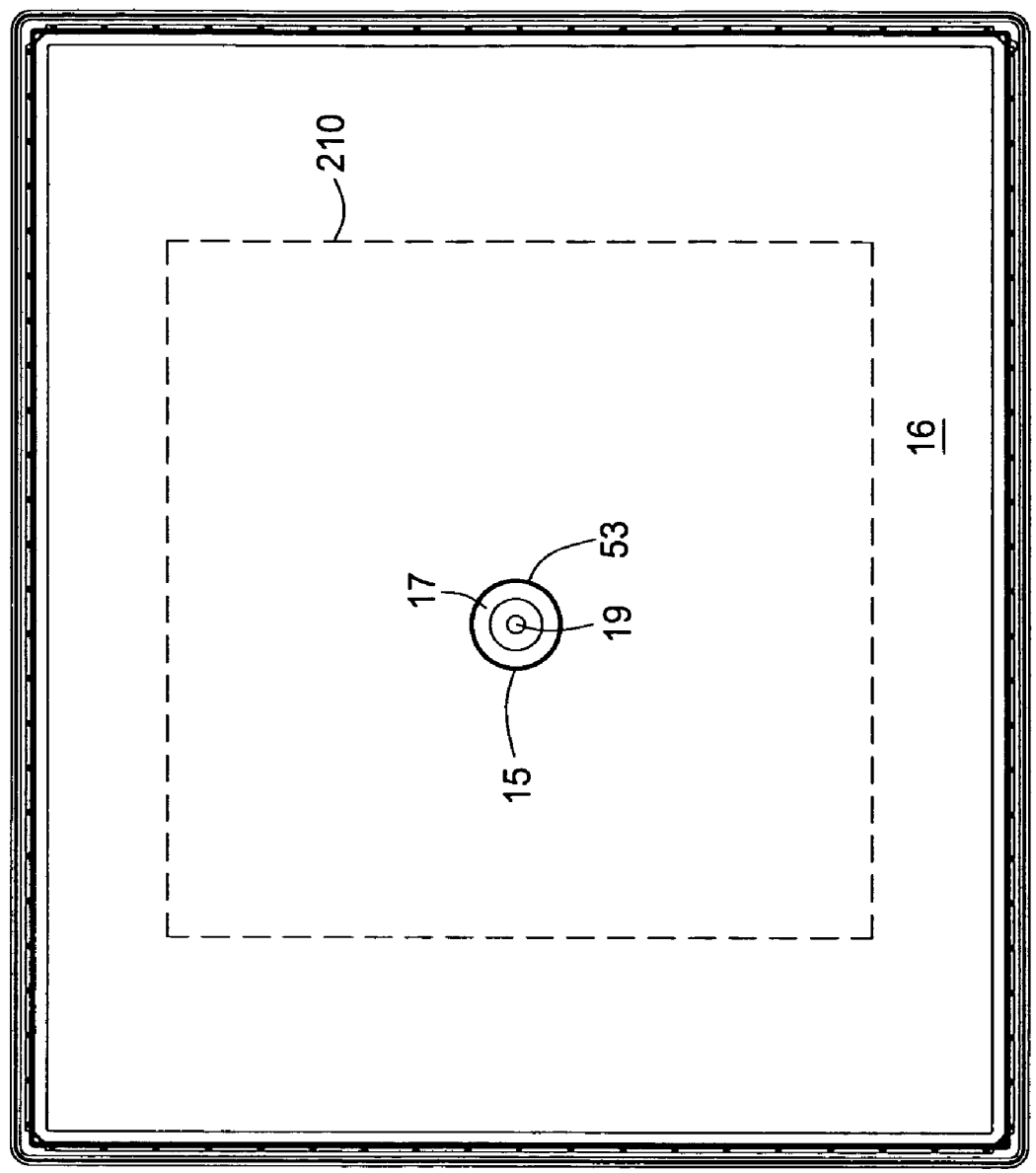
FIG. 2 is a top view of one embodiment of a chamber cover.

FIG. 2 is a top view of the chamber cover 16 showing the relative placement of the diffuser gravitational support 15, located in a center area 210 of the cover 16. The center area 210 is defined herein as any location within the perimeter of the cover 16, the backing plate 28, and the diffuser 20 that may provide a support point for the diffuser 20, or may alter the horizontal profile of the diffuser 20. Also shown is the longitudinal bore 19, through the gas block 17, surrounded by an annular collar 53. The diffuser gravitational support 15 may also be used solely as a diffuser support in the center area 210 of the cover 16 and a gas or gasses may be supplied to the diffuser 20 at other locations of the chamber 100. A diffuser 20 and backing plate 28, which are not shown in this view, are typically located below the cover 16. The diffuser 20 and backing plate 28 have dimensions substantially equal to the dimensions of the cover 16. The diffuser 20 and backing plate 28 have corresponding center areas 210 that may allow any of the elements depicted in this Figure to mate with the diffuser 20 and backing plate 28. Additionally, the elements depicted in this Figure may mate with or extend through the backing plate 28.

Figure 3:
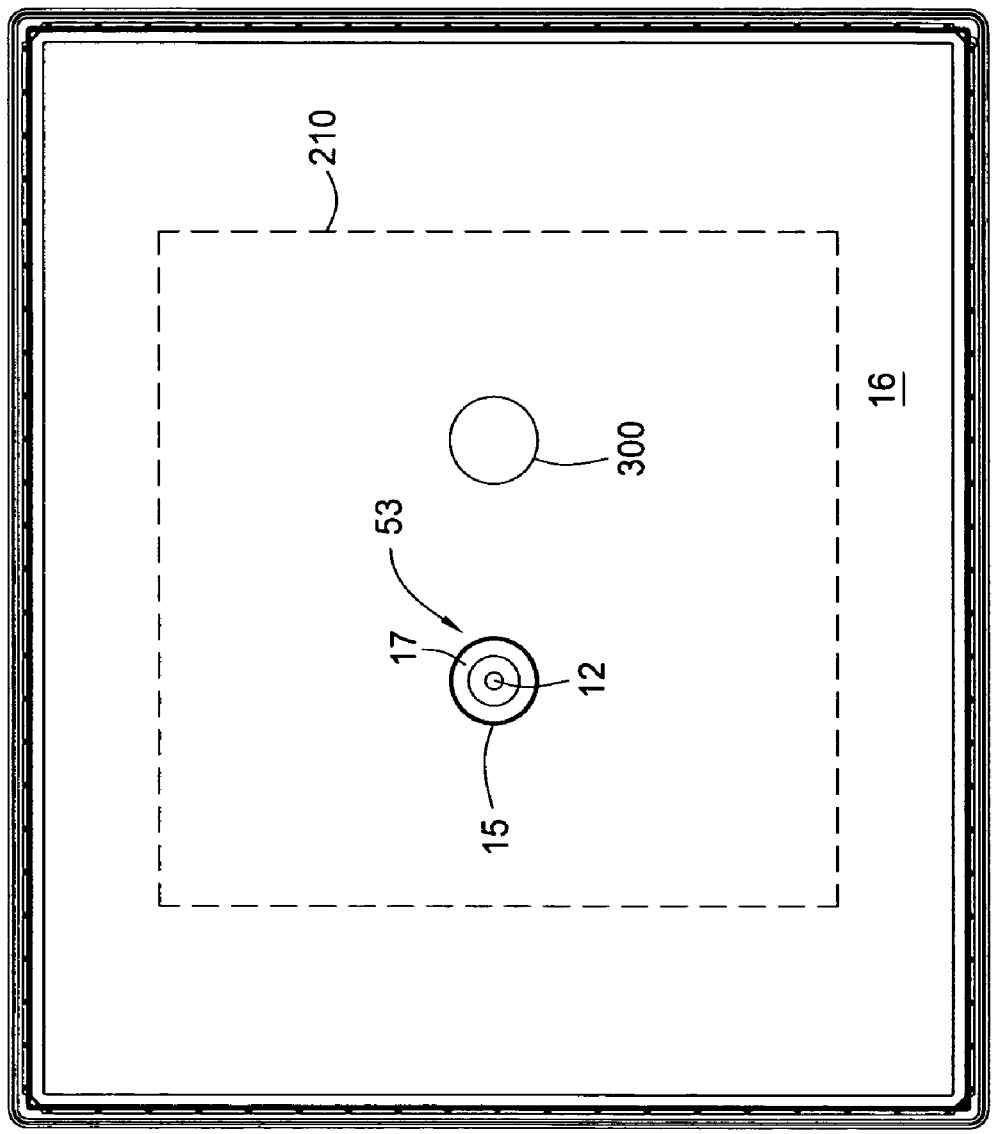
FIG. 3 is a top view of another embodiment of a chamber cover.

FIG. 3 is a top view of another embodiment of the chamber cover 16 showing an alternative location of the diffuser gravitational support 15 within the center area 210. As in FIG. 2, a diffuser 20 and backing plate 28 are not shown in this view, but are typically located below the cover 16. The diffuser 20 and backing plate 28 have dimensions substantially equal to the dimensions of the cover 16. The diffuser 20 and backing plate 28 have corresponding center areas 210 that may allow any of the elements depicted in this Figure to mate with the diffuser 20 and backing plate 28. Additionally, the elements depicted in this Figure may mate with or extend through the backing plate 28. The diffuser gravitational support 15 is shown off-center in the cover 16 but still within the center area 210. The center area 210 may be any centrally located area of the cover 16 (and corresponding locations in the backing plate and diffuser) that is determined as a support point for the diffuser 20. A gas passage 300 is shown on the cover 16 as an alternative to a process gas being provided to the diffuser by the diffuser gravitational support 15.

Figure 4:
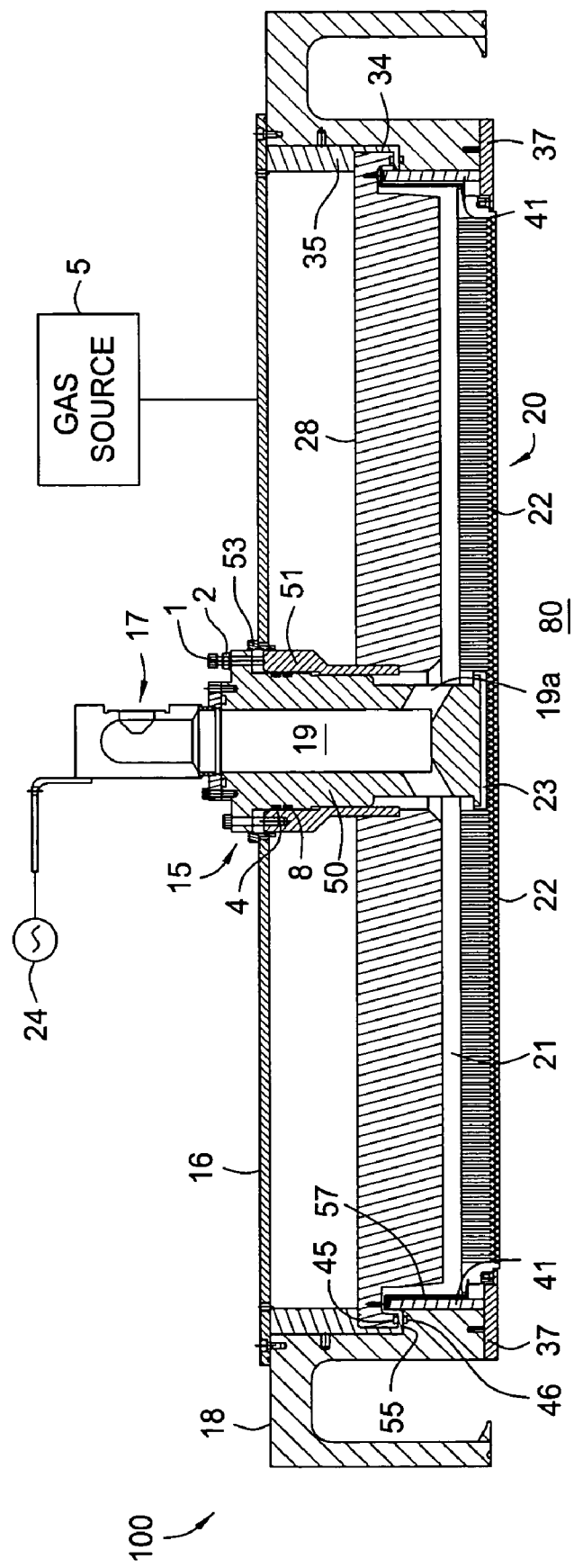
FIG. 4 is a detail view of one embodiment of a diffuser gravitational support.

FIG. 4 is a detailed side view of the diffuser support showing a diffuser 20 supported by a diffuser gravitational support 15, comprising a longitudinal support block 50, surrounded by a symmetrical support seat 51, suitably connected to the backing plate 28. The longitudinal support block 50 is made of a material that is chosen for its strength and resistance to process chemistry and is adapted to mate with and be supported by the symmetrical support seat 51. Materials for the longitudinal support block 50 may include steel, titanium, aluminum, or combinations thereof.

Figure 5:
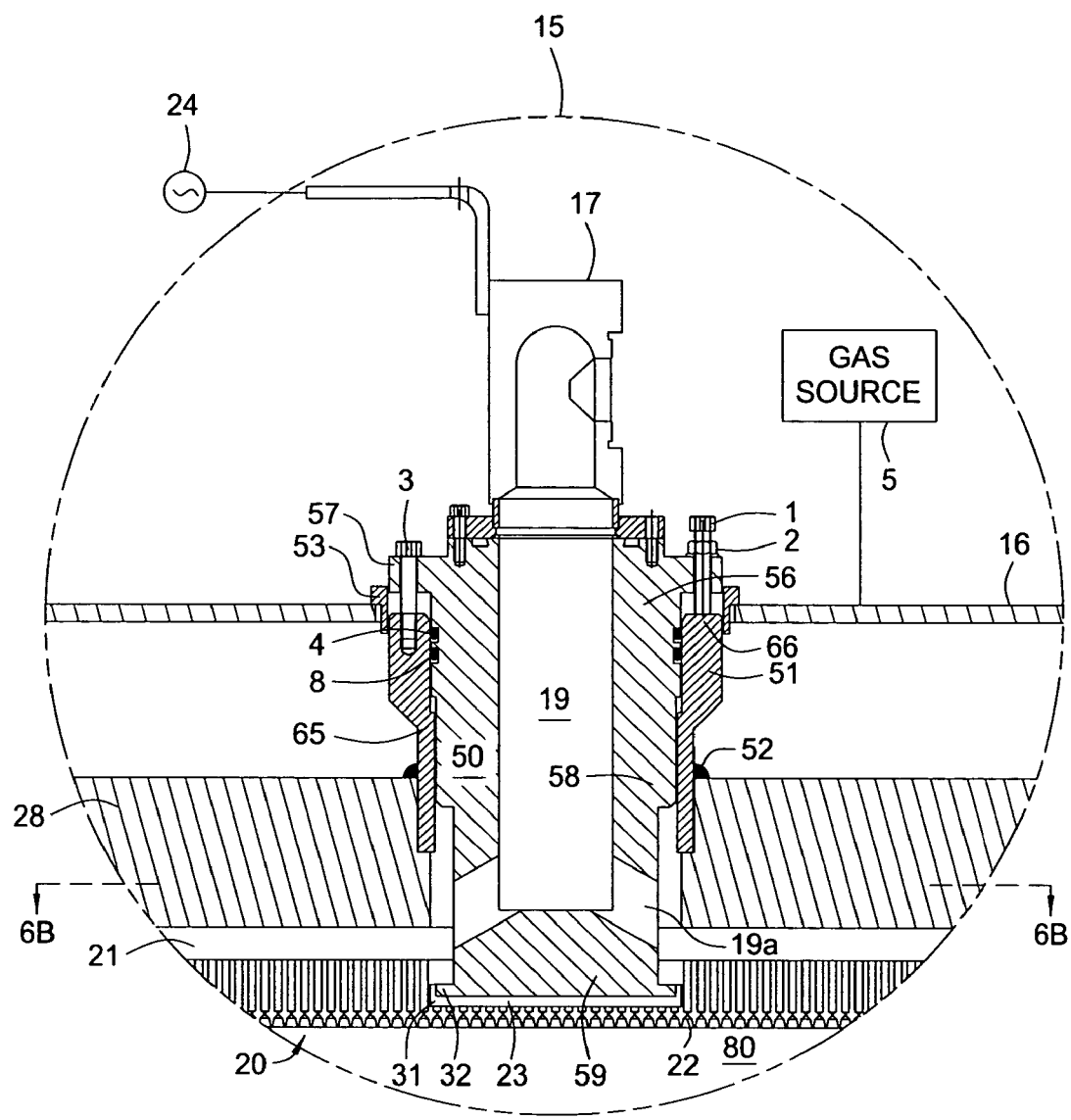
FIG. 5 is an exploded detail view of the diffuser gravitational support of FIG. 4.

FIG. 5 is an exploded detail view of the diffuser gravitational support 15 having a longitudinal support block 50 disposed in the symmetrical support seat 51. The seat 51 is disposed through a suitable bore in the backing plate 28 and connected by a weld 52 or other method known in the art. The support block 50 is sealed by appropriate O-rings 4 and 8 disposed against the inner wall of the support seat 51. The outer diameter of upper portion 56 of support block 50 is less than or equal to the inside diameter of upper area surface 66. Appropriate grooves are disposed in the outer diameter of upper portion 56 to seat the O-rings 4 and 8. These O-rings 4, 8 are configured to prohibit ambient atmosphere from entering the interior of chamber 100 and to prevent a process gas or gasses from escaping the chamber 100, thereby sealing the chamber 100. The longitudinal support block 50 extends upward through a suitable bore in the cover 16 as seen in FIGS. 2 and 3. The cover 16 supports an annular collar 53 that is in sealing communication with the cover 16 and the symmetrical support seat 51. A plurality of screws 1 and 3 bind the support block 50 to the support seat 51, and will be described in detail below.

Figure 6A:
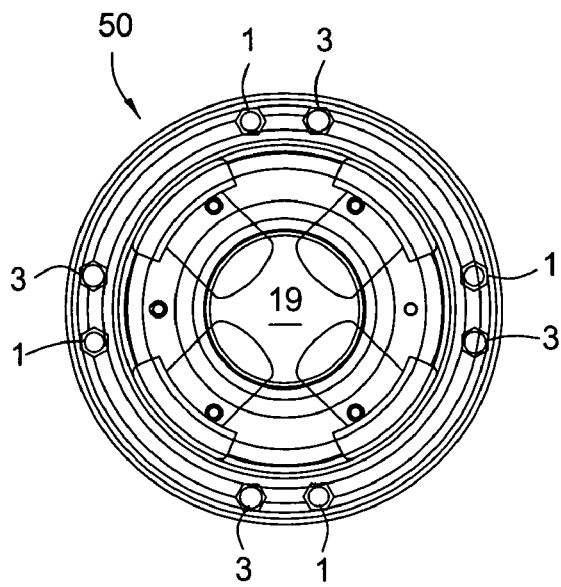
FIG. 6A is a detailed top view of the gas block adjustment and one embodiment of a mating mechanism.

Referring to FIGS. 5 and 6A, a plurality of screws 1, 3 are shown in a top view of the longitudinal support block 50, that serve to support and bind the support block 50, which is coupled to the diffuser 20, to the support seat 51. The longitudinal support block 50 has a symmetrical flange portion 57 that has a diameter greater than a center portion 58 of the support block 50. The flange portion 57 operates as a stop or limit for the gravitational support 15 by prohibiting vertical movement when contact is made between the flange 57 and the support seat 51. The flange portion 57 also serves as an adjustment mechanism by offering a mating connection for the plurality of jacking screws 1 via appropriate female threading in select locations in the flange 57. A separate plurality of appropriately spaced bores in the flange 57 provide mechanical communication for a plurality of locking screws 3 that are adapted to be in mechanical communication with appropriately threaded holes disposed in the upper area 66 of the seat 51. Although four jacking screws 1, and four locking screws 3, are shown, the invention is not limited to these numbers and may use any number to provide desired adjustment and support to the diffuser 20. The gravitational support 15 is coupled between the diffuser 20 and backing plate 28. The backing plate 28 is relatively thicker in cross-section than the diffuser 20, thus providing a substantially static support point. The diffuser 20 is typically more malleable relative the backing plate 28 due to relative thickness and the perforations in the diffuser 20. This relative malleability allows adjustment of the diffuser profile by adjusting the flange portion 57 of the gravitational support.

In operation, the longitudinal support block 50 is inserted into the symmetrical support seat 51, and the diffuser 20 is connected to the support block 50 via a mating connection 60 which will be described in detail below. At this point, the diffuser is suspended by the diffuser gravitational support 15, and flexible suspensions 57 (described in FIG. 1). The diffuser gravitational support 15 is then adjusted vertically via the plurality of jacking screws 1, allowing the diffuser 20 to be manipulated to present a desired horizontal profile that may be at least one of planar, concave, or convex. In one embodiment, the desired horizontal profile of the diffuser 20 is different than the horizontal profile of the substrate support 12. In another embodiment, the desired horizontal profile is similar to the horizontal profile of a substrate support 12. If the substrate support 12 is warped or somehow higher in the center than the perimeter (or vice-versa), the diffuser 20 may be adjusted to substantially match the horizontal profile of the substrate support 12, thereby providing a processing region 80 between the substrate 14 and the diffuser 20 that is substantially equal at any point. Alternatively, the diffuser 20 may be adjusted to a horizontal profile determined by the user or process that is different than the horizontal profile of the substrate support 12 and the processing region 80 between the diffuser 20 and the substrate 14 may not be equal at any point. Alternatively, the horizontal profile of the diffuser 20 may be chosen regardless of the horizontal profile of the substrate support 12.

If the diffuser 20 sags in any portion of the center area and a planar horizontal profile is desired in the profile of the diffuser 20, the jacking screws 1, which are in communication with upper area 66 of support seat 51, may be adjusted accordingly to raise the center portion of diffuser 20, relieving the diffuser 20 of any center sag caused by gravity or vacuum. If the desired horizontal profile of the diffuser 20 is a convex horizontal profile, the diffuser 20 may be adjusted accordingly by the jacking screws 1, in order to raise the center portion of the diffuser 20, as needed. If the desired horizontal profile of the diffuser 20 is a concave horizontal profile, the jacking screws 1 are raised by appropriate rotation and a plurality of locking screws 3, disposed in suitable threaded holes in the support seat 51, are appropriately rotated against the flange 57 to translate a compressive effect upon the diffuser 20 and forces or enables the center portion of the diffuser 20 to a lower position, thus producing a concave horizontal profile in the diffuser 20. Alternatively, the diffuser 20 may need no vertical adjustment and the locking screws 3 may be adjusted to lock the diffuser at that position.

Once the desired orientation of the diffuser 20 is adjusted and the diffuser 20 exhibits a desired horizontal profile, a locking or jam nut 2 is appropriately rotated to lock the jacking screw 1, thereby preventing subsequent movement of the jacking screw 1 which may translate to the diffuser 20. The plurality of locking screws 3 are then appropriately tightened to prevent any subsequent movement of any part associated with the gravitational support 15. If a concave orientation is desired in the diffuser 20, as described above, the jacking screws 1 may be appropriately rotated to tighten, and the jam nuts 2 are employed to prevent subsequent movement of any part associated with the gravitational support 15. In other words, when a concave orientation in the diffuser 20 is preferred, the locking screws 3 act as the adjustment, while the jacking screws 1 and the respective jam nuts 2 operate as the locking mechanism.

While the foregoing process has been described in ambient environment, any adjustments made to the horizontal profile of the diffuser 20, via the process disclosed, may be done after vacuum has been applied to the chamber 100 in order to adjust the diffuser 20 to compensate for any pressure induced deformations in the substrate support 12, the backing plate 28, or the diffuser 20. Any pressure induced changes may be determined and the desired horizontal profile of the diffuser 20 may be created. All openings in the chamber 100 that are not used for vacuum purposes may be sealed during this process and the O-rings 4 and 8 are adapted to provide a suitable seal while permitting movement of the longitudinal support block 50. Whether in ambient environment or under vacuum, adjustment parameters and relative distances between the substrate support 12 and the diffuser 20 may be determined by personnel using measurement devices, such as at least one gauge, when adjusting the horizontal profile of the diffuser.

Figure 6B:
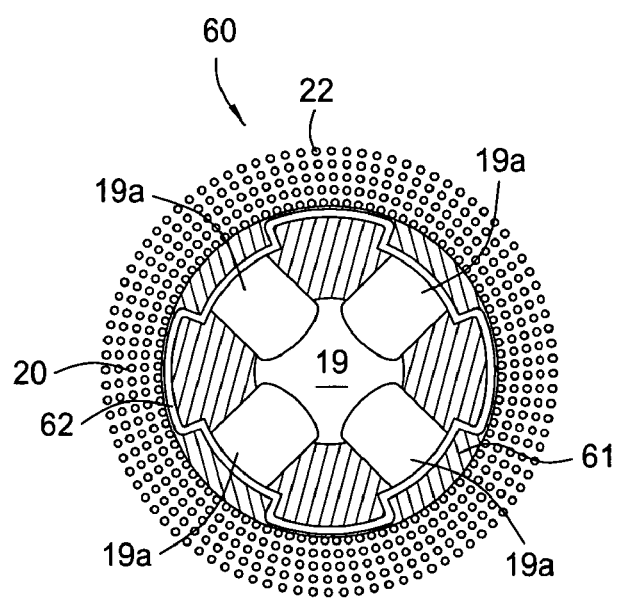
FIG. 6B is a detail view of one aspect of a mating mechanism.
Figure 6C:
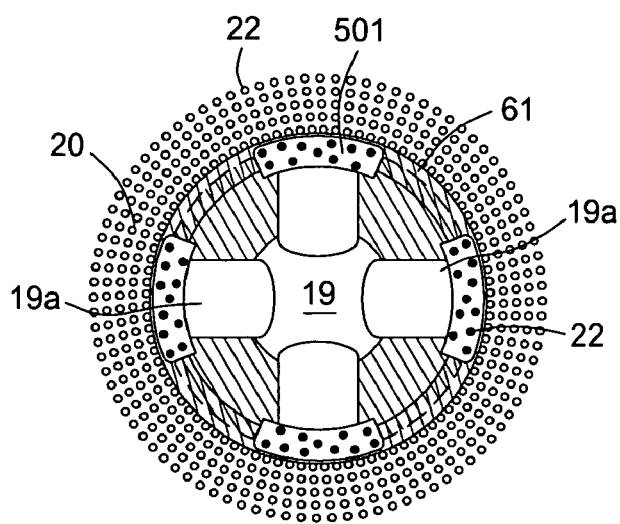
FIG. 6C is a detail view of other aspects of a mating mechanism.

FIGS. 5 and 6B-6C show one embodiment of a mating connection 60, which is depicted here as a slot and key configuration. The longitudinal support block 50 is connected to the diffuser 20 at a position below and adjacent the backing plate 28 by the mating connection 60. In one embodiment, the diffuser 20 is manufactured or altered to include a female connector 31, such as a plurality of symmetrical slots, while the support block 50 is manufactured to include a male connector 32, such as a plurality of symmetrical keys. The female connectors 31 are contained in the diffuser 20 and the male connectors 32 are incorporated in the support block 50. While four female connectors 31 and four male connectors 32 are shown in these exemplary Figures, it is contemplated that more or less may be used. Alternatively, the male connectors 32 may be a threaded member adapted to mate with appropriate female threads within the diffuser 20, thereby creating a mating connection 60 via a threaded connection.

FIG. 6B shows a top view of the mating connection 60 illustrating view B-B of FIG. 5. Shown is the lower portion 59 of the longitudinal support block 50 detailing the longitudinal bore 19 and angled bores 19a, with a plurality of male connectors 32 in an area between the angled bores 19a. The diffuser 20 is shown with orifices 22, a plurality of extended portions 61 adapted to support the male connectors 32, and a plurality of cut-out sections 62 configured to allow the male connectors 32 therethrough.

Referring to FIG. 5, the male connectors 32, measured diametrically, have an outer diameter smaller than the outside diameter of the flange 57, and have an outer diameter equal to or less than an inner diameter of the shoulder area 65 of the support seat 51. The upper area surface 66 of the support seat 51 has an inner diameter greater than the inner diameter than the shoulder area 65. The lower portion 59 of support block 50 has an outer diameter less than the outer diameter of the male connectors 32 and an outer diameter less than the center portion 58. The upper portion 56 of the support block 50 has an outside diameter less than the flange 57 and an outside diameter greater than the center portion 58. This diametrical scheme allows the support block 50 to provide two mechanical stops: one at the shoulder area 65 of the support seat 51, the other at an area below flange 57 and upper area 66 of the support seat 51.

The mating connection 60 depicted in FIG. 6B is seen in an unlocked position to show the relative position of angled bores 19a. Prior to the adjustment and locking down procedure detailed earlier, the support block 50 is inserted into the support seat 51 and male connectors 32 are inserted into the cut-out sections 62 in the areas between the extended portions 61, which are part of the diffuser 20. The support block 50 is then rotated 45° to a locked position, as shown in FIG. 6C. The cut-out sections 62 remain in the diffuser 20, while the male connectors 32 are disposed beneath the extended portions 61. The cut-out sections 62 create voids, such as channels 501 that are substantially aligned with the angled bores 19a, which may provide a substantially laminar flow of gasses from the longitudinal bore 19, into the large plenum 21, and the small plenum 23. The process gasses are then dispersed through a plurality of orifices 22 in the diffuser 20 during processing. It is to be noted that the orifices 22 continue in the region of the diffuser 20 that is occupied by the gravitational support 15, thereby providing an uncompromised flow of a gas or gasses through the diffuser 20.

Figure 7:
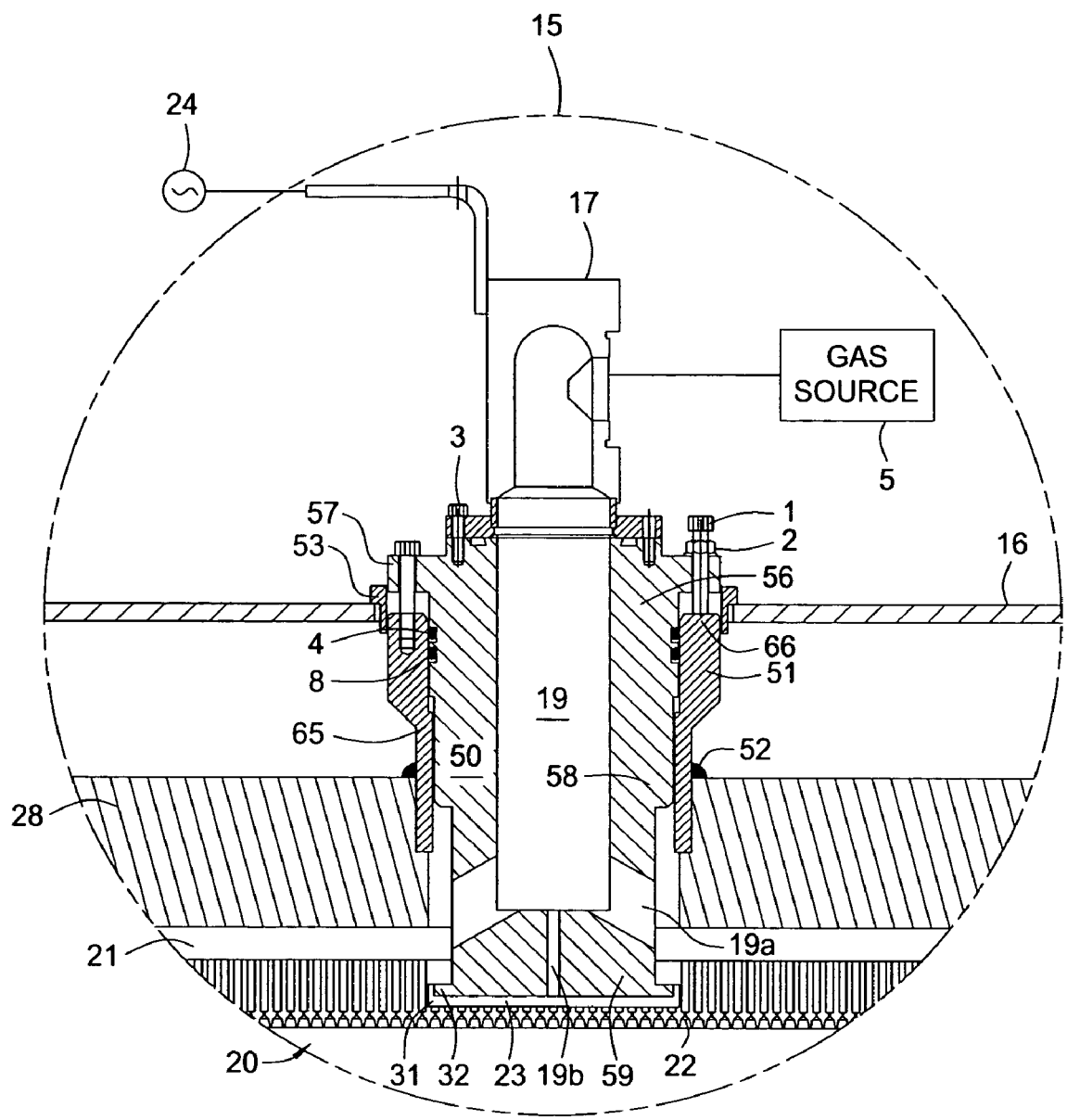
FIG. 7 is a schematic view of another embodiment of a diffuser gravitational support.

FIG. 7 is a schematic view of another embodiment of the diffuser gravitational support 15. Shown is a longitudinal support block 50 with an extended bore 19b from the longitudinal bore 19, in communication with the small plenum 23. The extended bore 19b may be optionally added to provide a greater volume of process gas to the small plenum 23, thereby increasing the volume and flow of process gas to the processing region 80 though the plurality of orifices 22 below the longitudinal support block 50.

Figure 8:
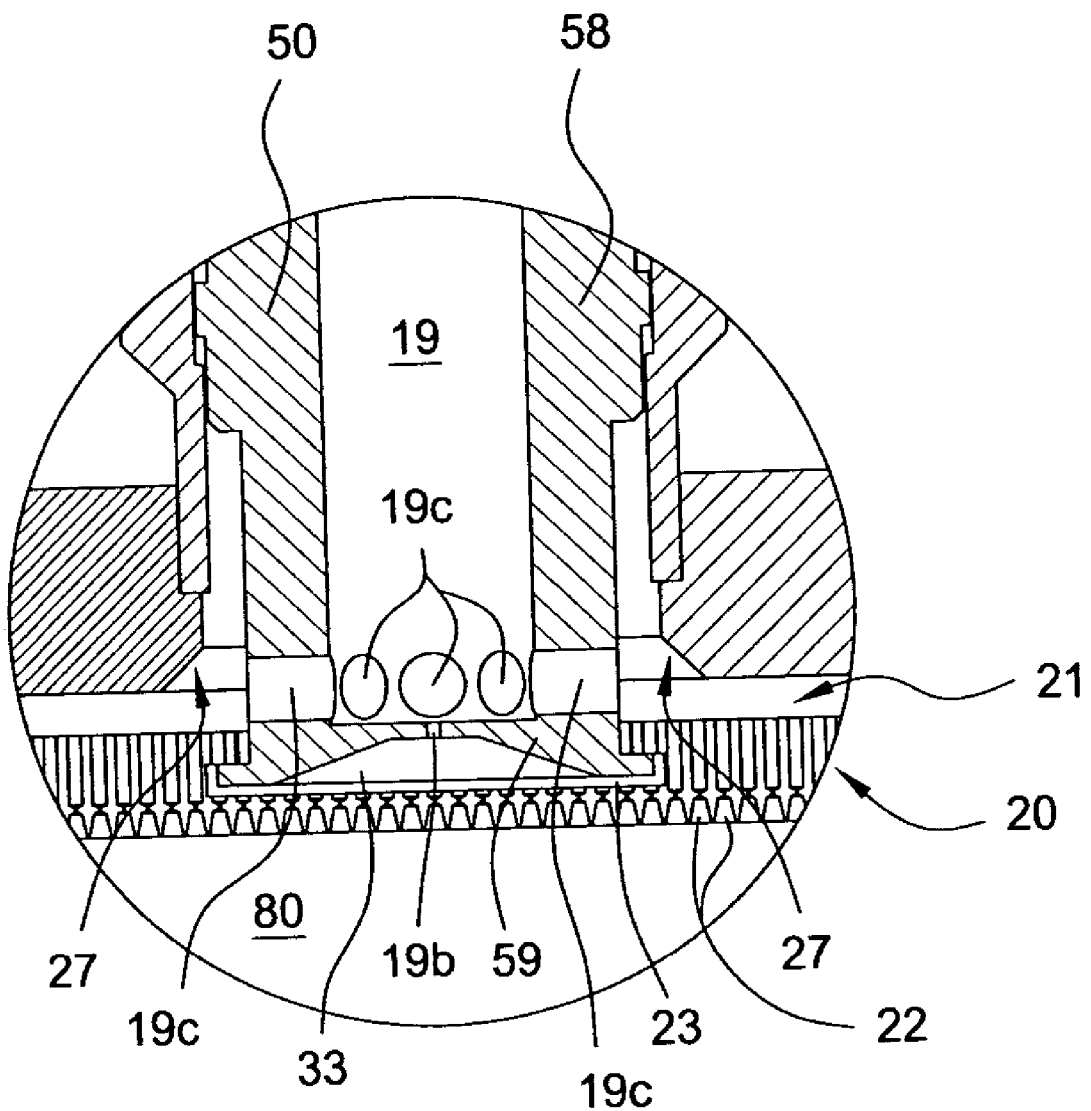
FIG. 8 is a partial schematic view of another embodiment of a diffuser gravitational support.

FIG. 8 is another embodiment of the diffuser gravitational support 15. In this embodiment, the longitudinal support block 50 has a longitudinal bore 19 that intersects with a plurality of transverse bores 19c. The longitudinal support block 50 has an annular void 33 in the lower portion 59 that is adapted to enlarge the area of the small plenum 23 within the diffuser 20. Also shown is a backing plate 28 having a circumferential chamfer 27 on its lower portion that is adapted to increase the surface area of the large plenum 21.

Figure 9A:
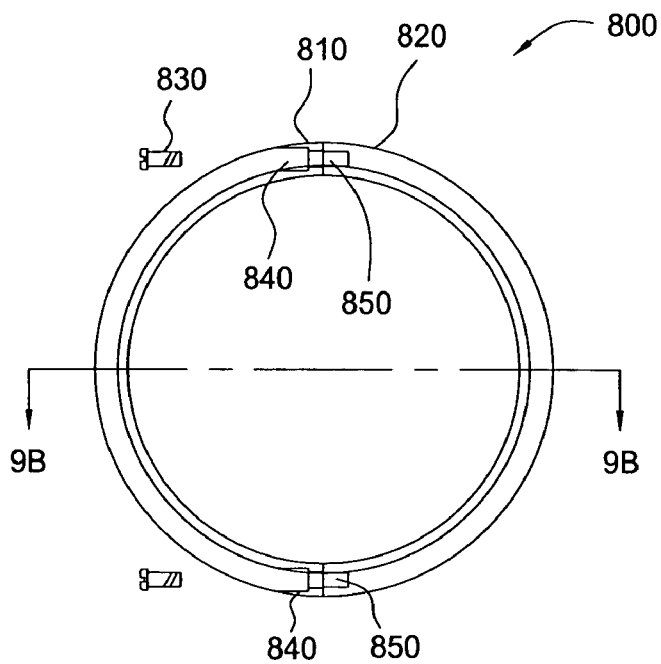
FIG. 9A is a top view of an orifice ring.

FIG. 9A is a top view of an orifice ring 800. In this embodiment, the orifice ring 800 consists of at least two parts, such as a first curved member 810 and a second curved member 820. The first curved member has at least one cavity 840 that is adapted to receive the shaft of a screw 830. The screw 830 may have a threaded portion that may be received by a threaded cavity 850 in the second curved member 820. Other embodiments are contemplated such as an orifice ring 800 that is one piece, or more than two pieces suitably joined and installed in the chamber.

Figure 9B:
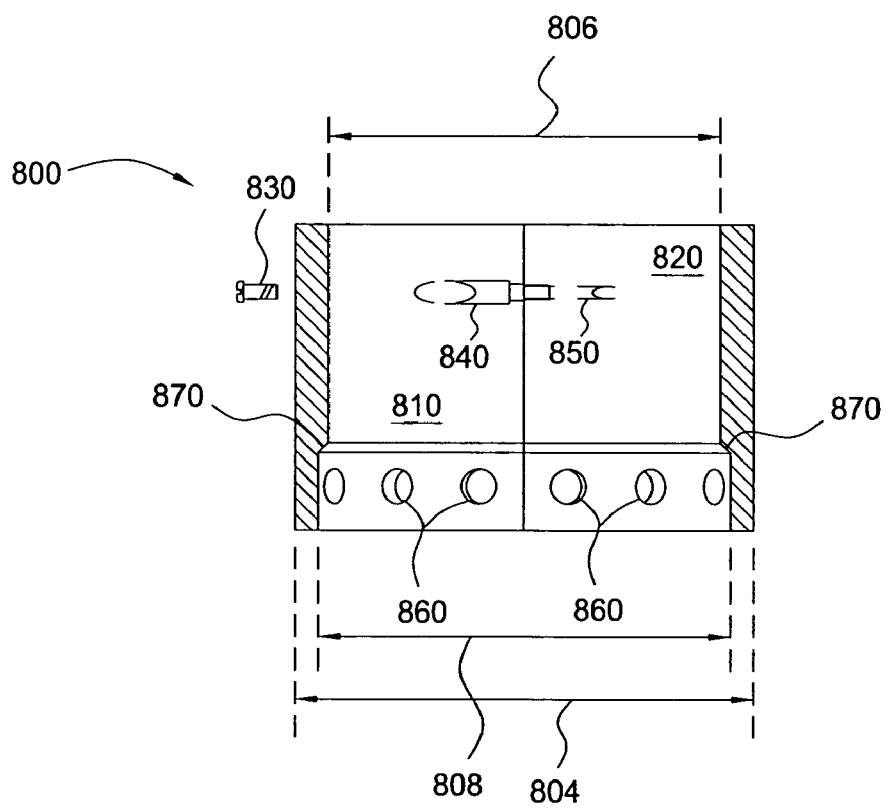
FIG. 9B is a side view of an orifice ring.

FIG. 9B is a side view of the orifice ring 800 depicted in FIG. 9A. The orifice ring 800 has an outer diameter 804, a first inner diameter 806, and a second inner diameter 808. The first inner diameter 806 is configured to surround the outer diameter of the lower portion 59 of the longitudinal support block 50. The second inner diameter 808 may be larger than the first inner diameter 806 and the respective inner diameters may be separated by an annular bevel 870. Also shown is a plurality of orifice ring holes 860 around a perimeter of the orifice ring 800 below the annular bevel 870.

Figure 10A:
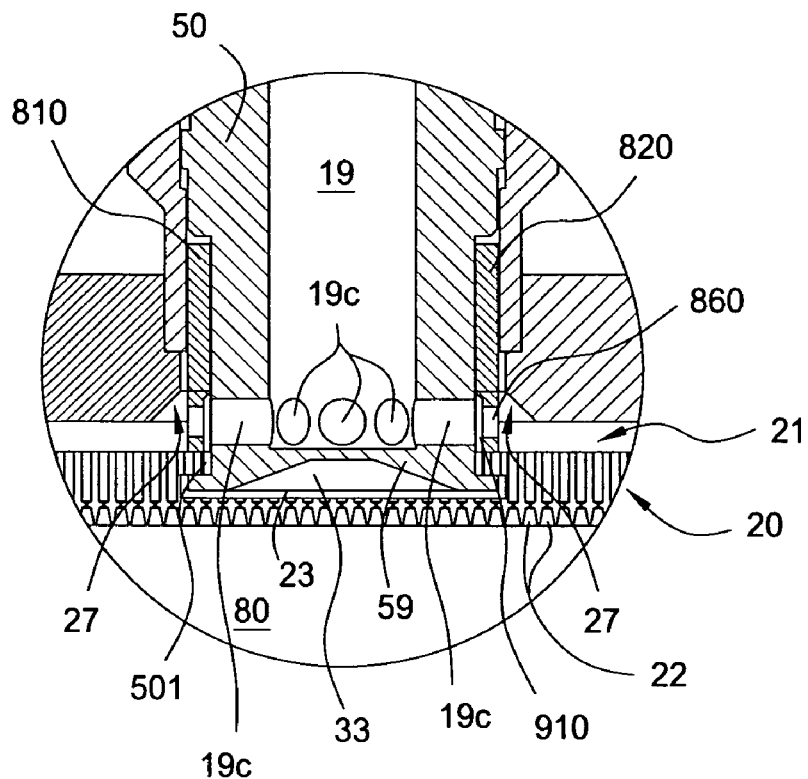
FIG. 10A is a partial schematic view of another embodiment of a diffuser gravitational support incorporating an orifice ring.

FIG. 10A is a detail view of the diffuser gravitational support 15 similar to the embodiment depicted in FIG. 8 and incorporating the orifice ring 800. The orifice ring 800 has a first curved member 810 and a second curved member 820 that surrounds the lower portion 59 of the longitudinal support block 50. Each of the curved members have a plurality of orifice ring holes 860 around the outer perimeter that, in one embodiment, are adapted to substantially align with the plurality of transverse bores 19c. The orifice ring 800 provides a tuning aspect to the flow of a process gas or gasses from the longitudinal bore 19 to the processing region 80. By varying the diameter of the holes 860, the gas flow may be restricted to the hole 860 diameter. Additionally or alternatively, the gas flow may be restricted by varying the alignment of the holes 860 and the transverse bores 19c.

For example, as a gas is flowed through the diffuser gravitational support 15, the gas may travel through the longitudinal bore 19 and to the plurality of transverse bores 19c virtually unrestricted. The plurality of orifice holes 860 may be of a smaller diameter than the diameter of the plurality of transverse bores 19c. The gas flowing from the transverse bores 19c may be restricted by the orifice ring holes 860 and a portion of the gas may be caused to flow into an interstitial space 910. The gas in the interstitial space 910 may then travel downward through the channels 501 and into the annular void 33, thereby supplementing gas flow through the orifice holes 22 from the small plenum 23. Any flow that is not interrupted by the orifice ring 800 may travel through the orifice ring holes 860 into the large plenum 21. The orifice ring 800 may be positioned such that the portion of a gas flowing through the orifice ring holes 860 may impinge on the circumferential chamfer 27, thus redirecting a portion of gas or gasses downward. It is also contemplated by the invention that the orifice ring 800 may not form an interstitial space 910, e.g., the orifice ring may be manufactured with only one inner diameter. Alternatively, or in combination, the lower portion 59 of the longitudinal support block 50 may contain an extended bore 19b to provide a flow path for a gas or gasses to the small plenum 23. As has been described, the orifice ring 800 may be manufactured, positioned, and adjusted according to a gas flow rate or volume that is determined by the user.

Figure 10B:
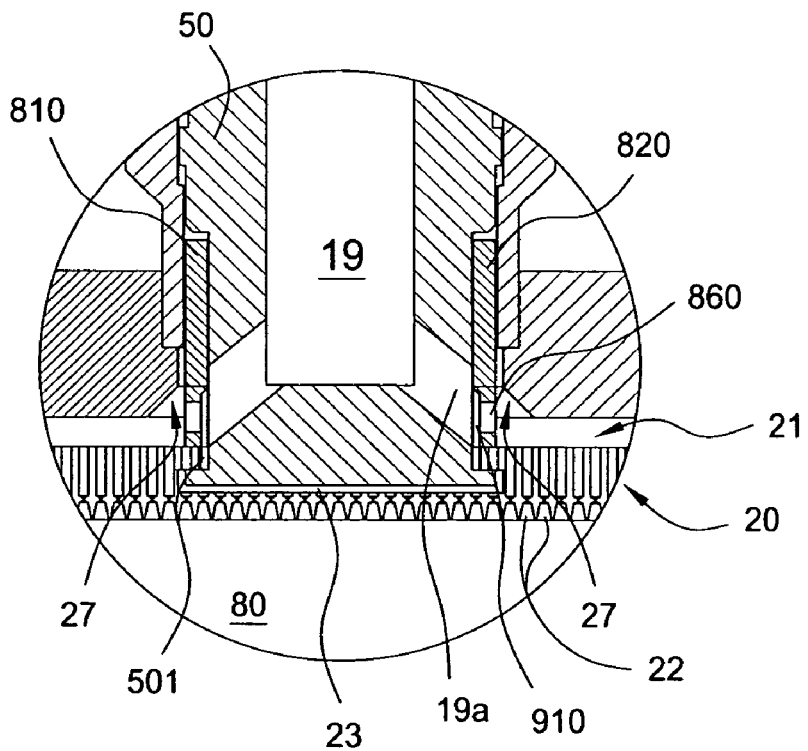
FIG. 10B is a partial schematic view of another embodiment of a diffuser gravitational support incorporating an orifice ring.

FIG. 10B is a detail view of the diffuser gravitational support 15 similar to the embodiment depicted in FIG. 4 and incorporating the orifice ring 800. The orifice ring 800 has a first curved member 810 and a second curved member 820 that surrounds the lower portion 59 of the longitudinal support block 50. Each of the curved members have a plurality of orifice ring holes 860 around the outer perimeter that, in one embodiment, are adapted to substantially align with the plurality of transverse bores 19c. In another embodiment, the orifice ring holes 860 may not fully align with the transverse bores 19c. In this embodiment, the orifice ring 800 may be rotated to further restrict gas flow from the transverse bores 19c to the large plenum 21.

Figure 11A:
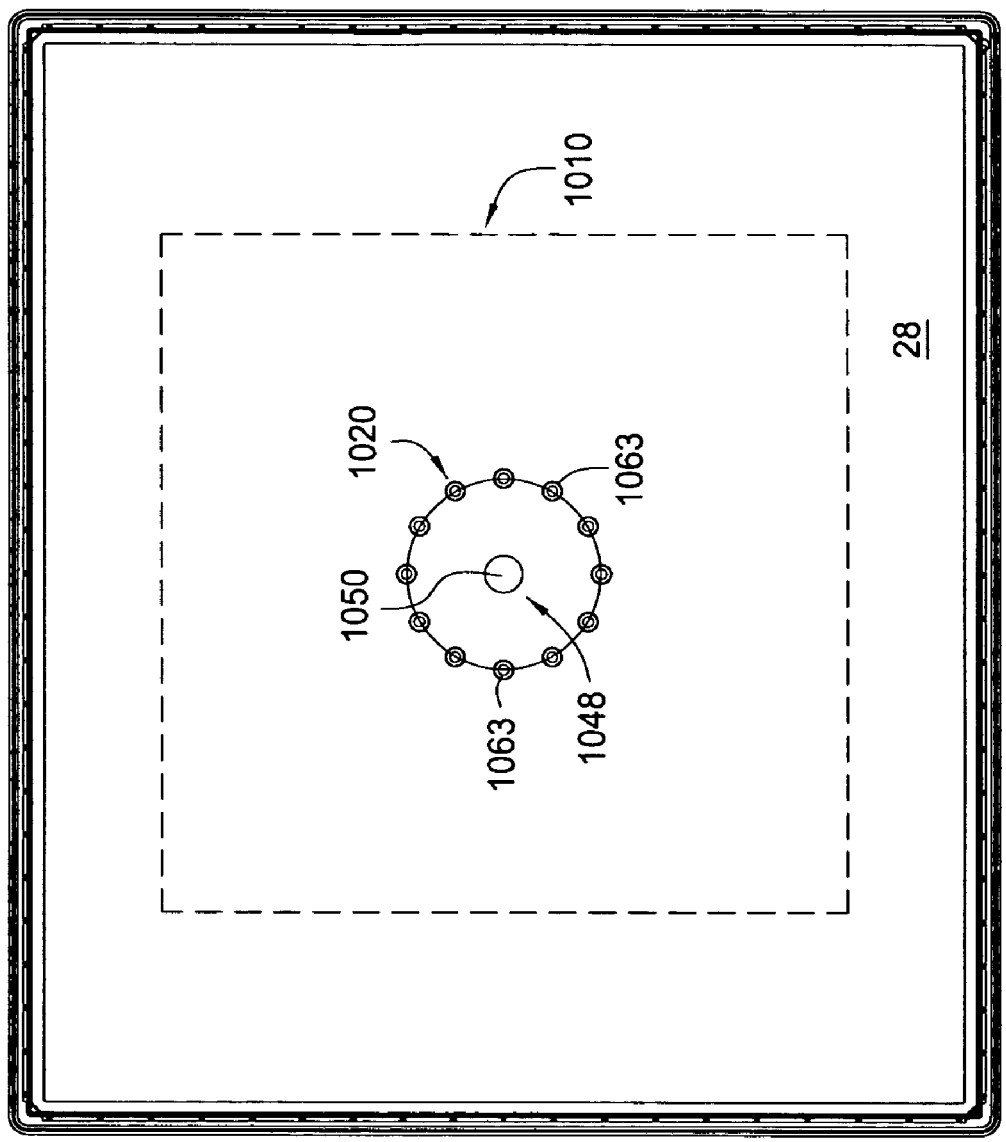
FIG. 11A is a top view of one embodiment of a backing plate.

FIG. 11A is a top view of another embodiment of a support member for supporting a gas distribution plate within a chamber. A backing plate 28 is shown having a plurality of bores 1063 formed through a center area 1010. Each of the plurality of bores 1063 are adapted to receive a threaded support 1020, such as a bolt, that is configured to mate with a corresponding mating portion in the diffuser 20. A diffuser 20, which is not shown in this view, is typically located below the backing plate 28. The diffuser 20 has dimensions substantially equal to the dimensions of backing plate 28. The diffuser 20 has a corresponding center area 1010 that is configured to allow any of the elements depicted in this Figure to mate with the diffuser 20. Although twelve bores in a symmetrical pattern are shown in this embodiment, the plurality of bores 1063 may be of any pattern, number, and size in the backing plate 28. Also shown is an opening 1048 in the backing plate 28 that is adapted to receive a gas delivery system 1050 to supply a process gas or gasses to diffuser 20. The diffuser may also have an appropriate coupling point formed therein to receive the gas delivery system 1050.

Figure 11B:
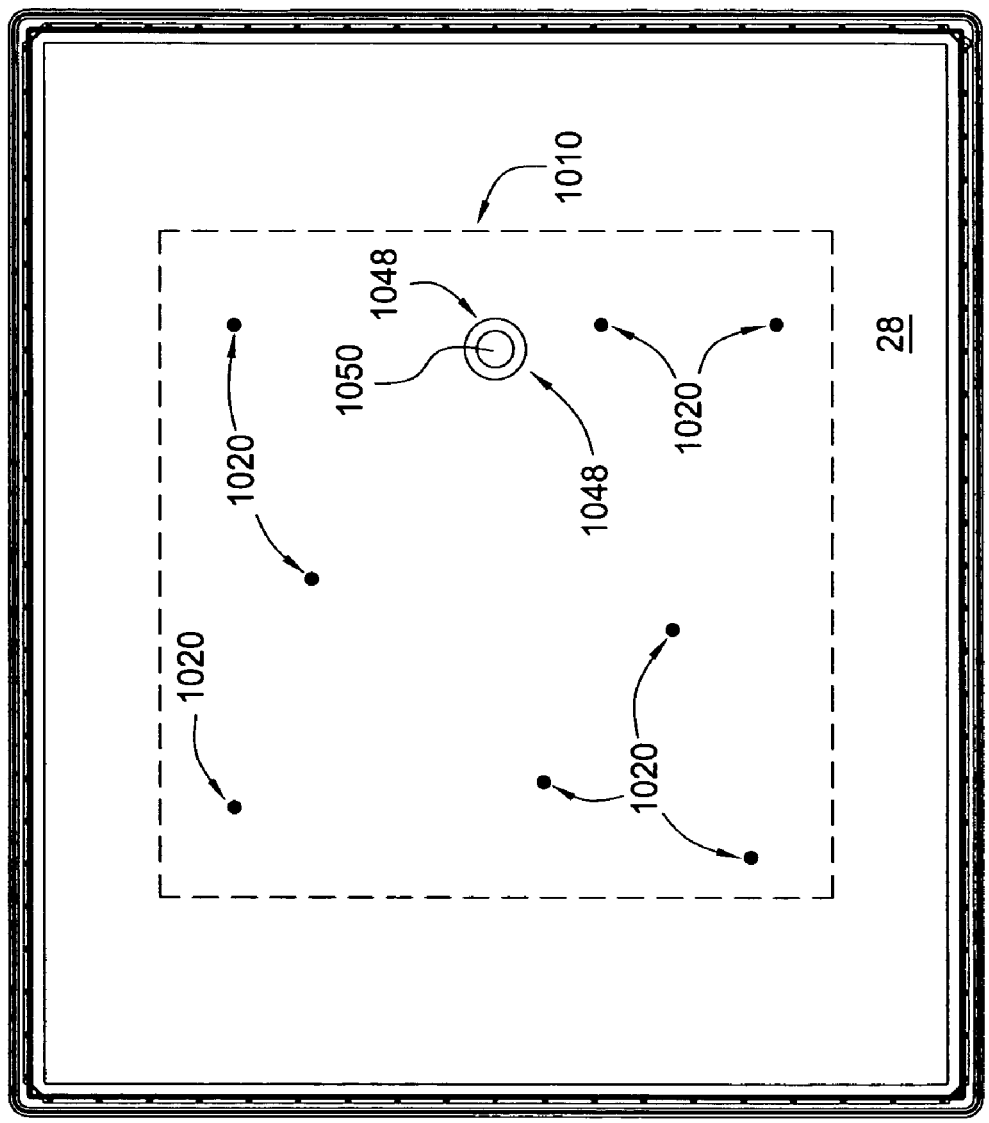
FIG. 11B is a top view of another embodiment of a backing plate.

FIG. 11B is a top view of another embodiment of a diffuser gravitational support for supporting a gas distribution plate within a chamber. The embodiment is similar to the embodiment shown in FIG. 11A with the exception of the threaded support 1020 pattern and the off center placement of the opening 1048. As in FIG. 11A, a diffuser 20 is not shown in this view but is typically located below the backing plate 28. The diffuser 20 has dimensions substantially equal to the dimensions of backing plate 28. The diffuser 20 has a corresponding center area 1010 that may allow any of the elements depicted in this Figure to mate with the diffuser 20.

Figure 12:
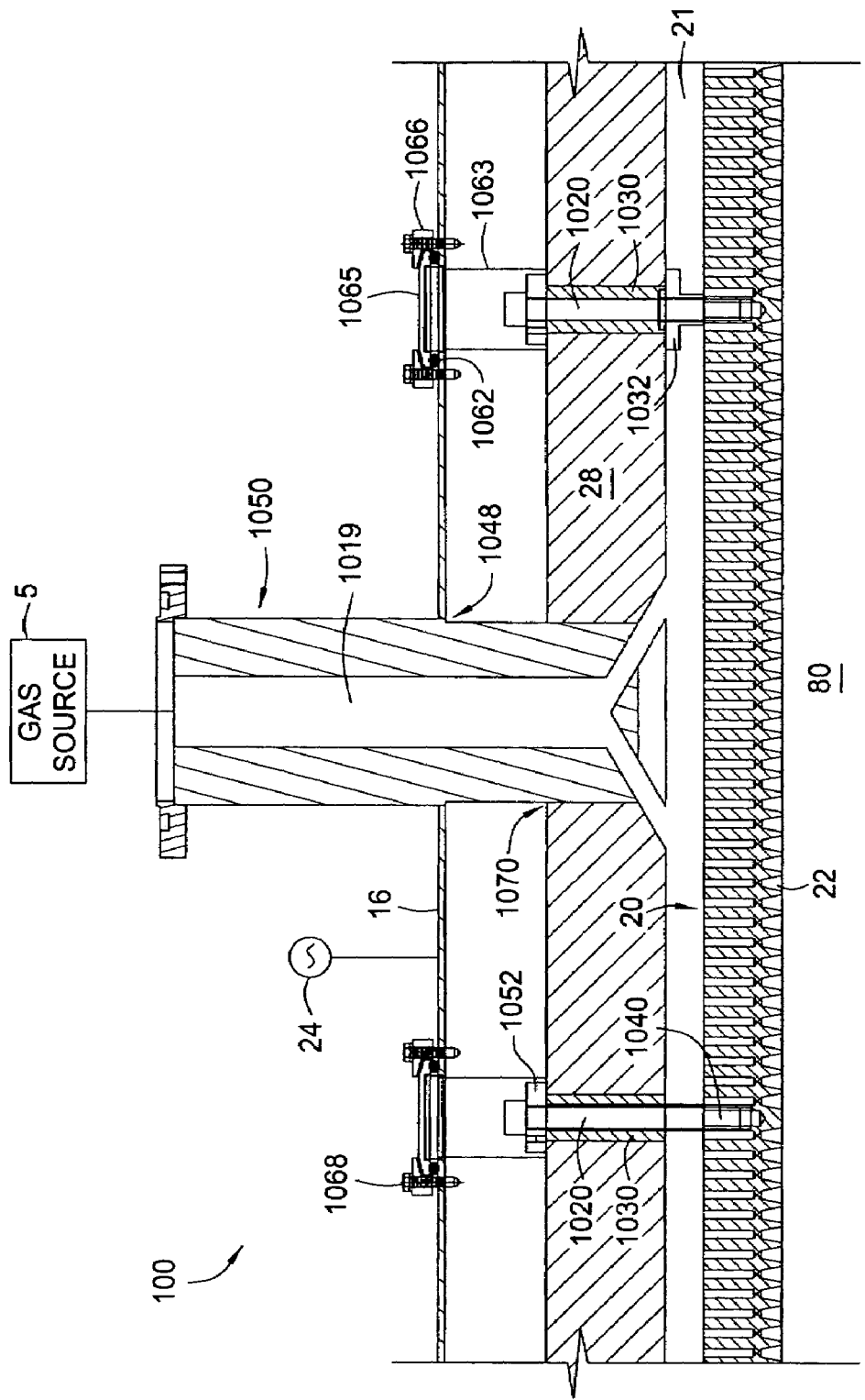
FIG. 12 is partial schematic view of another embodiment of a diffuser gravitational support.

FIG. 12 is a partial schematic side view of a diffuser 20 within a chamber 100. The chamber has a cover 16 with at least one opening 1048 in a center area that is adapted to receive a gas delivery assembly 1050. The gas delivery assembly 1050 is configured to receive a process gas or gasses from a gas source 5 and deliver the process gas to a large plenum 21 through a bore 1019. The process gas may then travel through the plurality of orifices 22 in the diffuser 20 to a processing region 80. As in other embodiments, the diffuser 20 is adapted to couple to a plasma source 24 to enable a plasma in the processing region 80.

The chamber 100 has a plurality of threaded supports 1020, such as bolts that extend through a first plate, such as a backing plate 28, to a second plate, such as the diffuser 20. The gas delivery assembly 1050 may be integral to the backing plate 28 or the backing plate 28 may be adapted to receive the gas delivery assembly 1050 through a bore-through 1070 in the backing plate 28. The threaded supports 1020 may be fabricated from a material that exhibits high tensile strength and resists reaction with process chemistry such as stainless steel, titanium, aluminum, or combinations thereof. The threaded supports 1020 may be made of any of the above materials and may further be coated with a process resistant coating such as aluminum. The backing plate 28 has a plurality of apertures 1030 formed therethrough in the center area. Each of the threaded supports 1020 is threaded and a portion of the threads are adapted to be received by a mating portion, such as female threads 1040, in the diffuser 20 that corresponds with the plurality of apertures 1030 in the backing plate 28. The female threads are disposed in a suitable bore that does not interfere with the plurality of orifices 22 in the diffuser plate 20. Also shown is a tubular partition 1063 and cap plate 1065 that covers each tubular partition 1063. The cap plate 1065 enables access to the threaded supports 1020 and together with the tubular partition 1063 provides a seal from ambient environment. The cap plate 1065 may be sealed by any known method, such as a clamp ring 1066 over the cap plate 1065, and fastened by screws 1068 to the cover 16, with an O ring 1062 therebetween. It is to be noted that the gas delivery assembly 1050 in this embodiment is adapted to be static in its position in the chamber 100, and sealed from ambient atmosphere by any known methods.

In operation, the threaded supports 1020 are inserted in the tubular partitions 1063, through the apertures 1030, and engaged to the respective female threads 1040 in the diffuser 20. The threaded supports 1020 are rotated to adjust the planar orientation of the diffuser 20. In this embodiment, the center area of the diffuser 20 is limited in vertical movement by the backing plate 28, which is designed to exhibit a much higher tolerance to forces such as gravity, vacuum, and heat. The backing plate 28 may yield to these forces, but not to the degree that may be experienced by the diffuser 20. In this fashion, the diffuser 20 may exhibit a deformation caused by the aforementioned forces, but the deformation is effectively tolled by the backing plate 28. It is also contemplated that the force parameters may be predetermined and any known deformation in the backing plate 28 and the diffuser 20 may be counteracted by the adjustment of the threaded supports 1020. The diffuser 20 may be adjusted to allow partial deformation, but the allowed deformation is stopped at a predetermined point when the threaded supports 1020 reach a mechanical limit, such as contacting a stop, which in this example is a washer 1052. The threaded supports 1020 are coupled between the diffuser 20 and backing plate 28. The backing plate 28 is relatively thicker in cross-section than the diffuser 20, thus providing a substantially static support point. The diffuser 20 is more malleable relative the backing plate 28 due to relative thickness and the perforations in the diffuser 20 which allows adjustment of the diffuser profile by adjusting the length of the threaded supports 1020.

In another aspect, at least one adjustment member 1032, such as a spacer may be used to maintain a static distance between the diffuser 20 and the backing plate 28, thereby using the threaded supports 1020 to lock the adjustment member 1032 in place. In this embodiment, the diffuser 20 may be formed to exhibit a desired horizontal profile by varying a thickness of the at least one adjustment member 1032. The at least one adjustment member 1032 may be thicker to form a convex horizontal profile to the center portion of the diffuser 20 when installed, or thinner to form a concave horizontal profile. The threaded supports 1020 may then be rotated into the female threads 1040 to lock the adjustment members 1032 in place. Although only one adjustment member 1032 is shown, the invention is not limited to this and any number of adjustment members 1032 may be used, for example, each threaded support 1020 may have an adjustment member coupled thereto. When the adjustment members 1032 are used, the vertical movement of the diffuser 20 is limited to any movement of the backing plate 28 when reacting to forces such as heat, pressure, and gravity.

Figure 13:
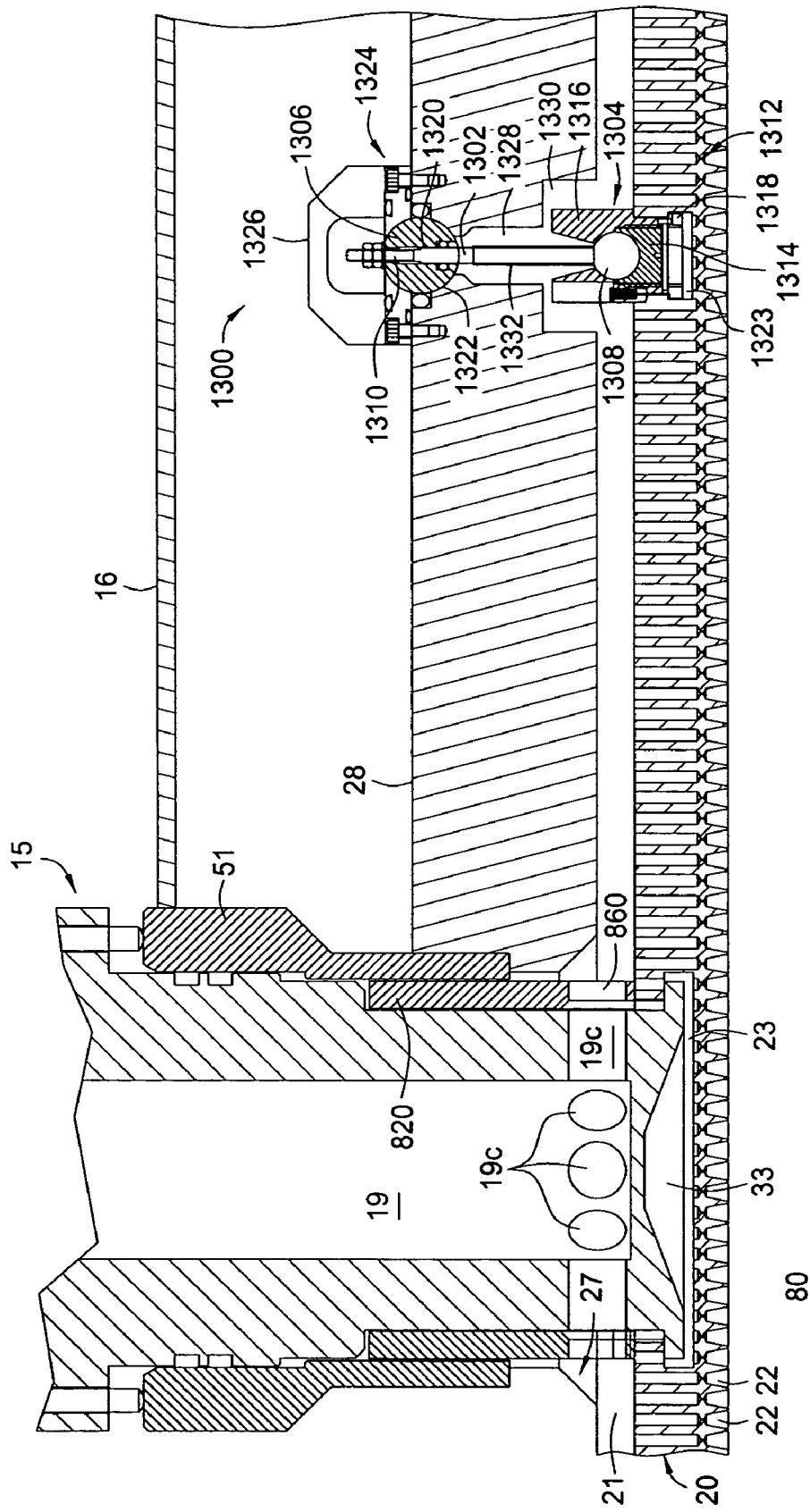
FIG. 13 is one embodiment of a pivotal support.

FIG. 13 is another embodiment of a support member for supporting a gas distribution plate which, in this embodiment is a pivotal support 1300. The pivotal support 1300 may be used alone, or in combination with, the diffuser gravitational support 15. The pivotal support 1300 may also be used alone, or be used in combination with the threaded supports 1020. The pivotal support 1300 in this embodiment is positioned outward from the diffuser gravitational support 15 and is coupled to the diffuser 20 and the backing plate 28. The pivotal support 1300 comprises a ball stud 1302 adapted to couple with a ball stud housing 1304 coupled to the diffuser 20 and an upper pivotal member 1306 coupled to the backing plate 28. The ball stud 1302 is an elongate member coupled on one end to a lower pivotal member 1308 and having a threaded portion 1310 on an opposing end. The ball stud 1302 may be machined as one piece with the lower pivotal member 1308 or may be a bolt or rod screwed into or otherwise coupled to the lower pivotal member 1308. The upper pivotal member 1306 is adapted to engage with a support seat 1322 formed in the upper surface of the backing plate 28. A sealing block 1324 is adapted to couple to the upper surface of the backing plate 28 to house the upper portion of the upper pivotal member 1306 and to facilitate sealing the chamber interior from ambient environment. A cover cup 1326 is coupled to the upper surface of the backing plate 28 to cover exposed portions of the pivotal support 1300 and further sealing the chamber interior. In order to receive the pivotal support 1300, the backing plate 28 has a first bore 1328 below the support seat 1322 and an expanded bore 1330 configured to allow unobstructed movement of the ball stud 1302 and the ball stud housing 1304.

The lower pivotal member 1308 is generally a spherical solid and the upper pivotal member 1306 is also spherical in shape having a central bore 1320 to receive the ball stud 1302. The lower pivotal member 1308 and upper pivotal member 1306 are made of a material that exhibits mechanical strength with minimal reactivity to process chemistry. The ball stud 1302 may be made of the same material as the material for the lower pivotal member 1308 and the upper pivotal member 1306. The materials for the ball stud 1302, upper pivotal member 1306, or the lower pivotal member 1308 include stainless steel, titanium, or aluminum, and combinations thereof. If the elongated portion of the ball stud 1302 is made of a material that exhibits some reaction with process chemistry, a tubular shield 1332 made of aluminum may be coupled to the ball stud 1302.

The lower pivotal member 1308 is adapted to couple to the ball stud housing 1304 and the ball stud housing 1304 is adapted to couple to the diffuser 20 by a coupling mechanism 1312. The ball stud housing 1304 has a lower seat 1314 coupled to a seat housing 1316, thereby housing the lower pivotal member 1308. The coupling mechanism 1312 in this embodiment is similar in design and function to the mating connection 60 described in FIGS. 5 and 6B-6C with the exception of being scaled down. The seat housing 1316 has a plurality of male connectors 1318 that selectively engage a plurality of slots (not shown) formed in the diffuser 20. The diffuser 20 has a plenum 1323 that facilitates process gas flow from the large plenum 21 to the processing region 80 through the plurality of orifices 22 formed below the pivotal support 1300.

Figure 14:
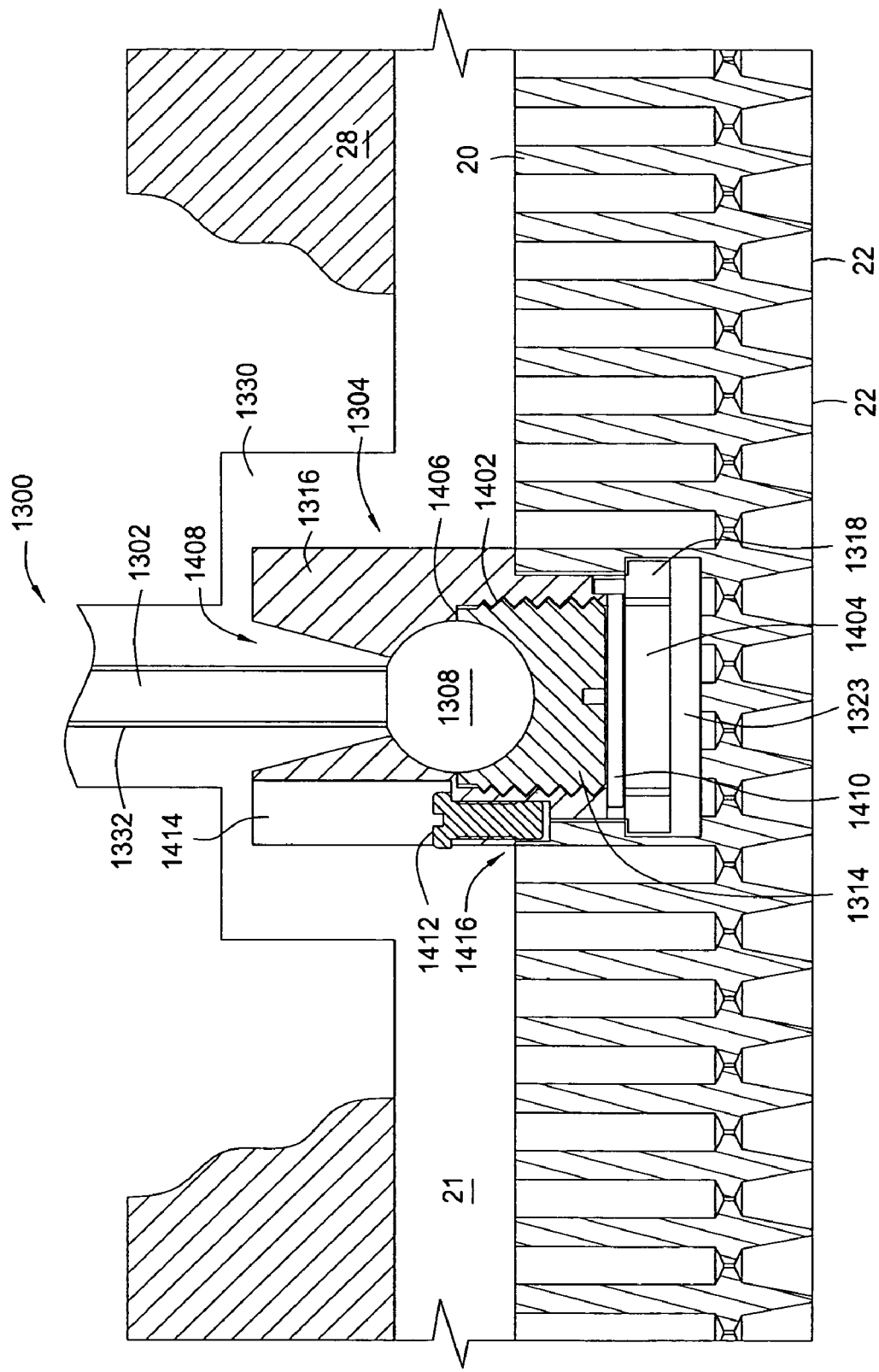
FIG. 14 is a detail view of the diffuser coupled to a pivotal support.

FIG. 14 is a detail view of the diffuser 20 coupled to the pivotal support 1300. Prior to coupling to the diffuser 20 as shown, personnel may assemble the ball stud housing 1304 away from the backing plate 28 and the diffuser 20. To facilitate assembly, the diffuser 20 and backing plate 28 may be removed from the chamber and positioned for assembly. The ball stud 1302 may be coupled to the seat housing 1316 by inserting the elongated portion of the ball stud 1302 into a conical opening 1408 formed in the seat housing 1316. In order to house the lower pivotal member 1308, the lower seat 1314 is inserted through a passage 1404 formed in a lower surface of the seat housing 1316. The lower seat 1314 and the seat housing 1316 are configured to mate by a threaded connection 1402. The seat housing 1316 may have female threads and the lower seat 1314 may have male threads. The passage 1404 is sized to allow the lower seat 1314 to pass therethrough and allow the threads to mate. The lower seat 1314 may be appropriately rotated until an upper portion of the lower seat contacts a shoulder 1406 formed in the seat housing 1316. The seat housing 1316 and the lower seat 1314 each have an inner surface that is shaped to house and seat the lower pivotal member 1308 while facilitating pivotal movement of the ball stud 1302.

When the shoulder 1406 is contacted by the lower seat 1314, a pin 1410 may be used to prevent the lower seat from backing off the shoulder 1406. When all of the ball studs 1302 are coupled to the ball stud housings 1304, each of the ball stud housings 1304 may be inserted into slots formed in the diffuser 20 adapted to mate with the male connectors 1318. The ball stud housing 1304 is rotated 45° and may be stabilized by a set screw 1412 inserted into a channel 1414 formed in the seat housing 1316. The channel 1414 has a lower portion that is threaded and mates with the threads on the set screw 1412. The set screw 1412 is appropriately rotated to contact a shoulder formed in the channel 1414. The set screw 1412 is configured to extend beyond the threaded portion of the channel 1414 and the extended portion mates with a recess 1416 formed in the diffuser 20, thus preventing further rotation of the ball stud housing 1304. When all of the ball stud housings 1304 have been coupled to the diffuser 20 and locked by the set screws 1412, the diffuser 20 may be handled for further assembly and the ball stud housings 1304 may remain intact.

Figure 15:
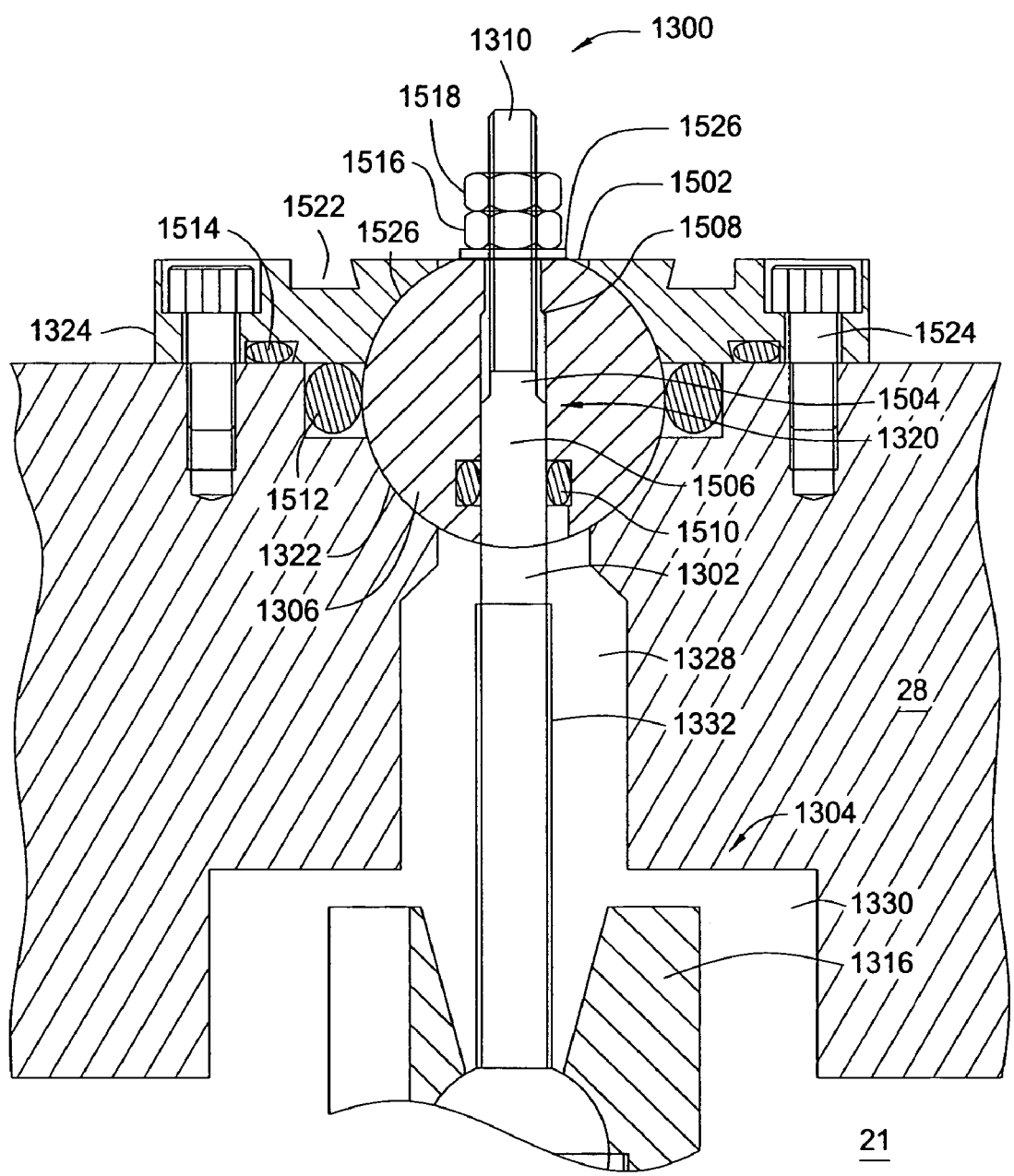
FIG. 15 is a detail view of a pivotal support coupled to a backing plate.

FIG. 15 is a detail view of the pivotal support 1300 coupled to the backing plate 28. Subsequent to installation of the ball stud housing 1304 having the ball stud 1302 therein, the diffuser 20 may be joined to the backing plate 28. In this example, the backing plate 28 is and positioned upside-down outside of the chamber and the diffuser 20, having one or more ball studs 1302 coupled thereto, is positioned upside-down above the backing plate 28. Having the diffuser 20 in this position allows the threaded portion 1310 of the ball stud 1302 to hang downward and allows personnel to insert the ball studs 1302 into the expanded bore 1330 and the first bore 1328 until the threaded portion 1310 is exposed, and protrudes through, the support seat 1322 formed in the backing plate 28. The upper pivotal member 1306 may then be installed by guiding the threaded portion 1310 through the central bore 1320. When the threaded portion 1310 protrudes through the central bore 1320, a nut 1516 may be coupled to the threaded portion 1310, thereby securing the upper pivotal member 1306 to the ball stud 1302. In another embodiment, the central bore 1320 of the upper pivotal member 1306 may include female threads and the threaded portion 1310 of the ball stud 1302 may couple to the upper pivotal member by a threaded connection.

In one embodiment, an upper portion 1506 of the ball stud 1302 has a reduced diameter portion 1504. The central bore 1320 of the upper pivotal member 1306 has a portion that receives the upper portion 1506 and the reduced diameter portion 1504 facilitating vertical movement within the central bore 1320 until the upper portion contacts a shoulder area 1508 formed in the upper pivotal member 1306. The shoulder area 1508 functions as a vertical limit for the ball stud 1302, thus stopping any vertical movement of the ball stud 1302 during adjustment when the upper portion 1506 contacts the shoulder area 1508. The upper pivotal member 1306 also comprises at least one O-ring 1510 disposed in a recess formed in the upper pivotal member 1306 adapted to prevent escape of process gasses from the chamber and to form a vacuum tight seal between the ball stud 1302 and the upper pivotal member 1306. The pivotal support 1300 also comprises an O-ring 1512 disposed in a recess formed in the backing plate 28 and facilitates prevention of process gas loss and vacuum sealing between the upper pivotal member 1306 and the backing plate 28. The O-rings 1510 and 1512 may be made of suitable materials such as a polymeric or rubber material adapted to withstand process conditions.

With a plurality of upper pivotal members 1306 coupled to the respective ball studs 1302 by nuts 1516, the diffuser 20 and backing plate 28 are coupled together by a plurality of pivotal supports 1300. The diffuser 20 and backing plate 28 may be positioned right-side up in a position that the diffuser and backing plate would take when installed into the chamber. At this time the diffuser gravitational support 15 may be inserted into the support seat 51 (FIG. 5) and appropriately rotated to couple to the diffuser 20. Alternatively, the diffuser 20 may employ a gas delivery assembly 1050 and a plurality of threaded supports 1020 (FIG. 12) may be coupled to the diffuser.

The pivotal support 1300 also comprises a sealing block 1324 that has a central opening 1502 to receive the threaded portion 1310 and nut 1516 of the ball stud 1302. The sealing block 1324 provides an upper support seat 1526 for the upper pivotal member 1306 is configured to allow the upper pivotal member 1306 to move unrestricted. The central opening 1502 is configured to allow movement of the upper pivotal member 1306 and the ball stud 1302 without the nut 1516 or optional washer 1526 contacting the sealing block 1324. The sealing block 1324 comprises at least one O-ring 1514 that provides a further seal between the backing plate 28 and ambient environment and is adapted to couple to the backing plate by a plurality of fasteners 1524, such as bolts. The sealing block also has an O-ring groove 1522 formed in an upper surface.

Figure 16:
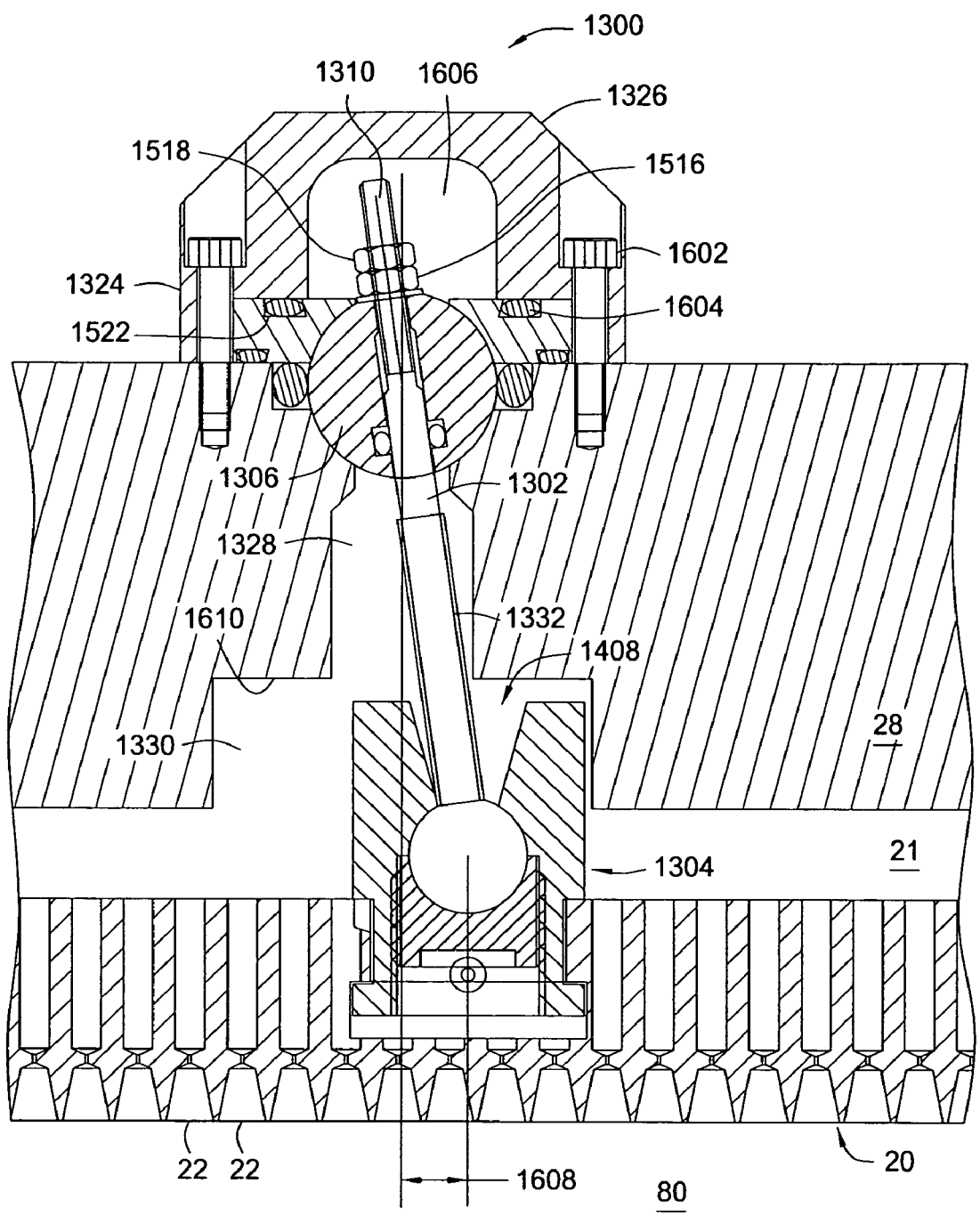
FIG. 16 is a detail view of a pivotal support 1300 coupled to a diffuser.

FIG. 16 is a detail view of another embodiment of the pivotal support 1300 coupled to the diffuser 20. A cover cup 1326 is shown coupled to an upper surface of the sealing block 1324 by a plurality of cover bolts 1602. The cover bolts may threadedly connect to corresponding holes formed in the sealing block 1324, or may extend through the sealing block 1324 to appropriately threaded holes formed in the backing plate, in which case the plurality of cover bolts 1602 would use a different hole pattern in the backing plate 28 than the plurality of fasteners 1524 used to couple the sealing block 1324. A cover O-ring 1604 made of a polymer or rubber may be disposed in the O-ring groove 1522 to provide further sealing of the pivotal support 1300 within the chamber. The cover cup 1326 also provides a cover area 1606 within the interior of the cover cup 1326 to allow unobstructed movement of the threaded portion 1310 and the nut 1516.

Figure 17A:
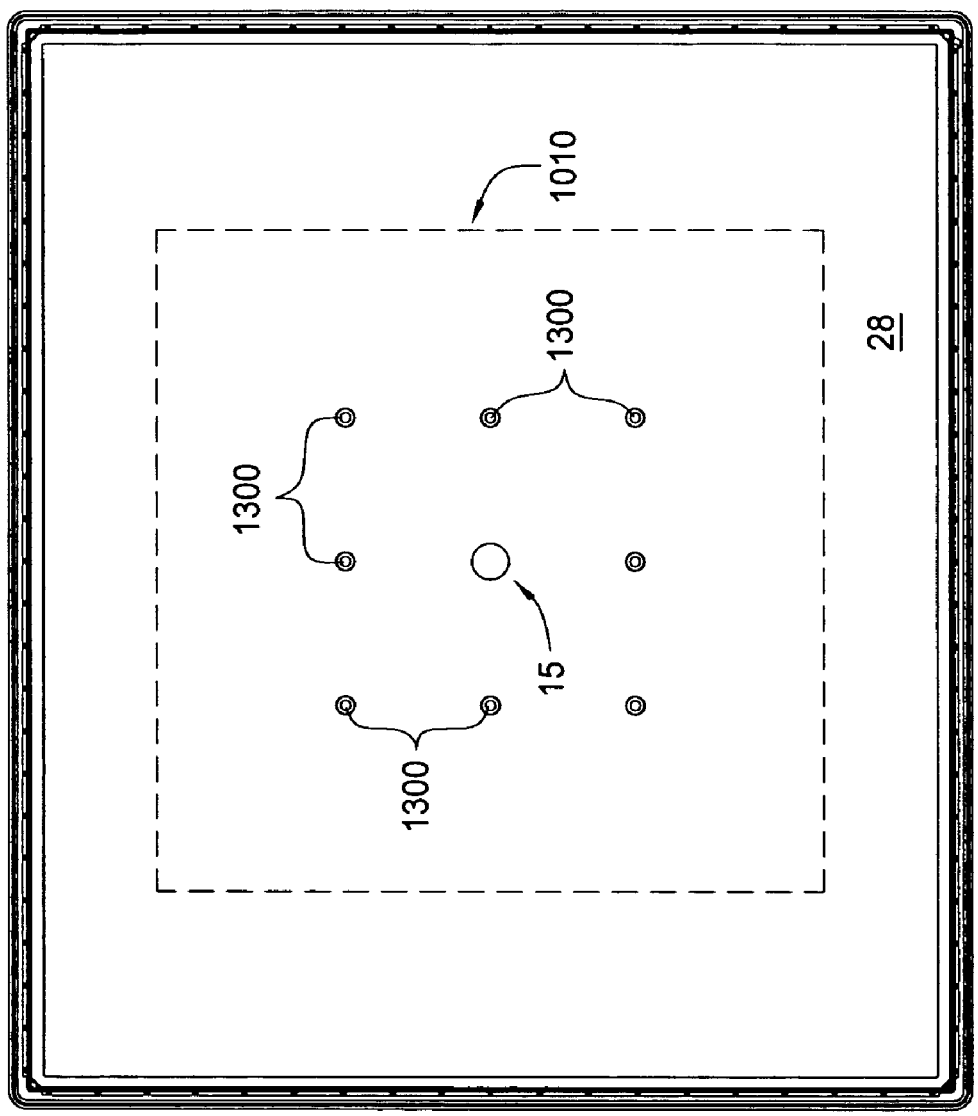
FIG. 17A is a top view of one embodiment of a backing plate having a plurality of pivotal supports coupled thereto.

FIG. 17A is a top view of one embodiment of a backing plate 28 having a plurality of pivotal supports 1300 coupled thereto. A plurality of pivotal supports 1300 and a diffuser gravitational support 15 are shown coupled to the backing plate 28 within a center area 1010. A diffuser 20, which is not shown in this view, is typically located below the backing plate 28. The diffuser 20 has dimensions substantially equal to the dimensions of backing plate 28. The diffuser 20 has a corresponding center area 1010 that may allow any of the elements depicted in this Figure to mate with the diffuser 20. Although eight pivotal supports 1300 in a symmetrical pattern are shown in this embodiment, the pivotal supports 1300 may be of any pattern, number, and size in the backing plate 28.

Figure 17B:
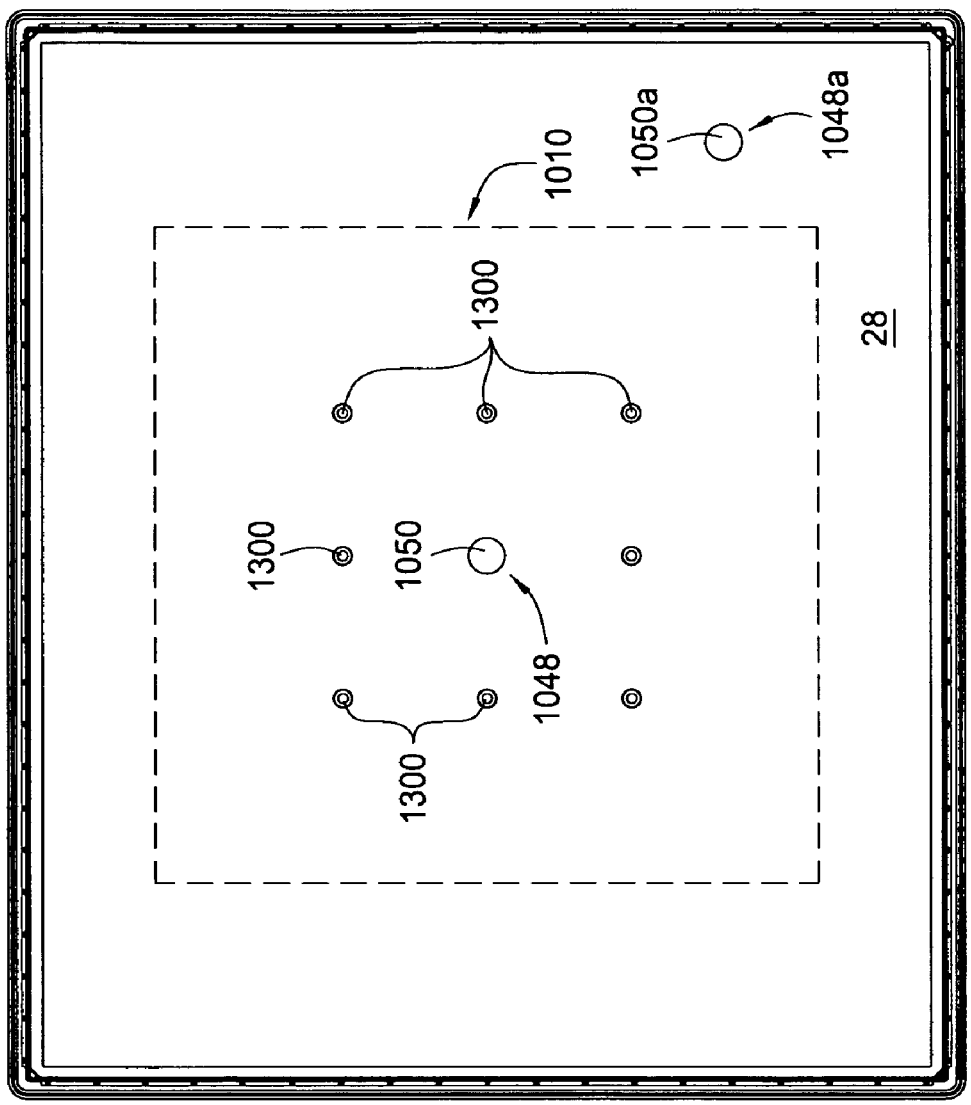
FIG. 17B is a top view of another embodiment of a backing plate having a plurality of pivotal supports.

FIG. 17B is a top view of another embodiment of a backing plate 28 having a plurality of pivotal supports 1300 and at least one opening 1048 for a gas delivery system 1050. All of the elements may be located in a center area 1010, or alternatively, an alternative opening 1048*a* configured to receive an alternative gas delivery system 1050*a* may be coupled to the backing plate outside of the center area 1010. A diffuser 20, which is not shown in this view, is typically located below the backing plate 28. The diffuser 20 has dimensions substantially equal to the dimensions of backing plate 28. The diffuser 20 has a corresponding center area 1010 that may allow any of the elements within the center area 1010 depicted in this Figure to mate with the diffuser 20. If the alternative gas delivery system 1050*a* is used, the diffuser will have a corresponding coupling point formed therein adapted to receive the-alternative delivery system. Although eight pivotal supports 1300 in a symmetrical pattern are shown in this embodiment, the pivotal supports 1300 may be of any pattern, number, and size in the backing plate 28.

Figure 17C:
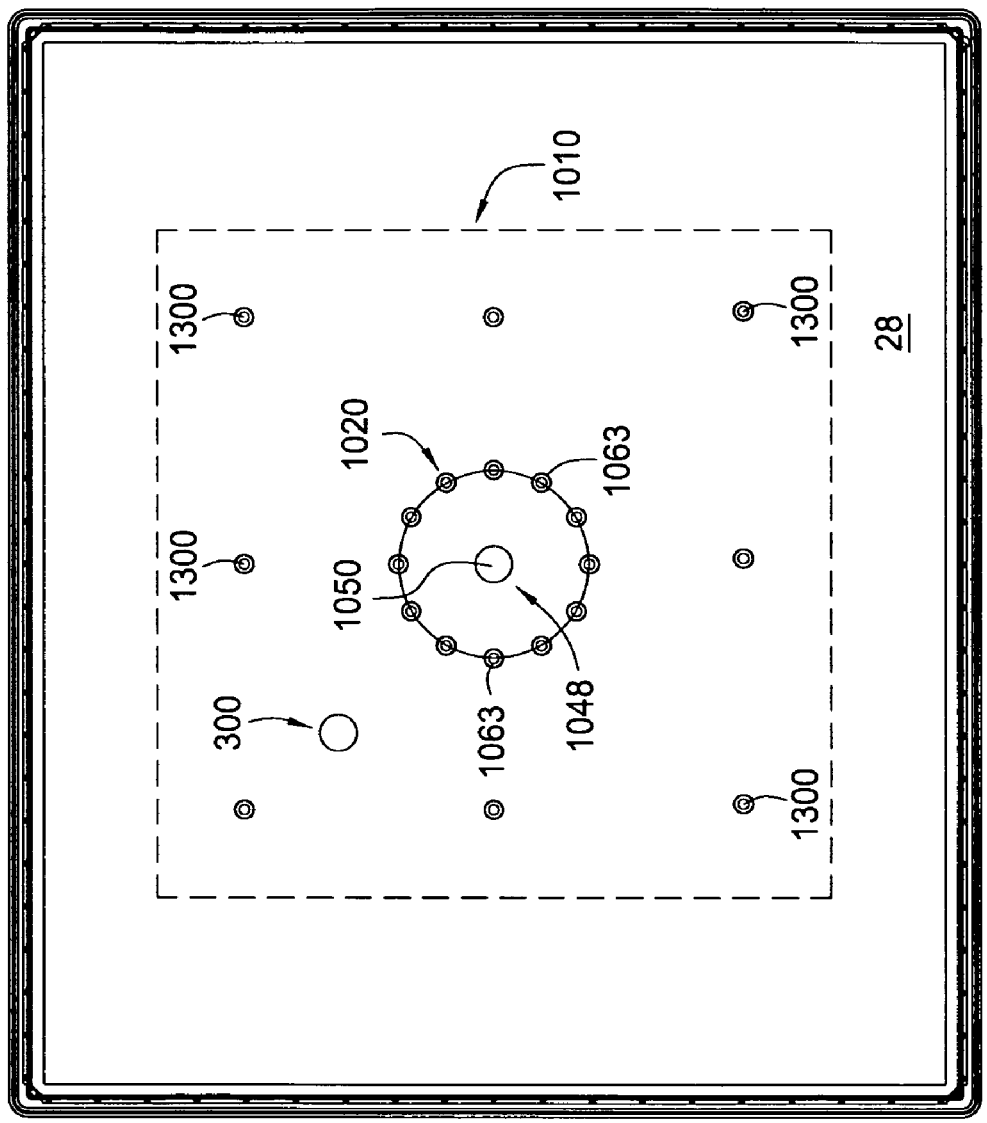
FIG. 17C is a top view of another embodiment of a backing plate having a plurality of pivotal supports and a plurality of threaded supports.
Figure 18A:
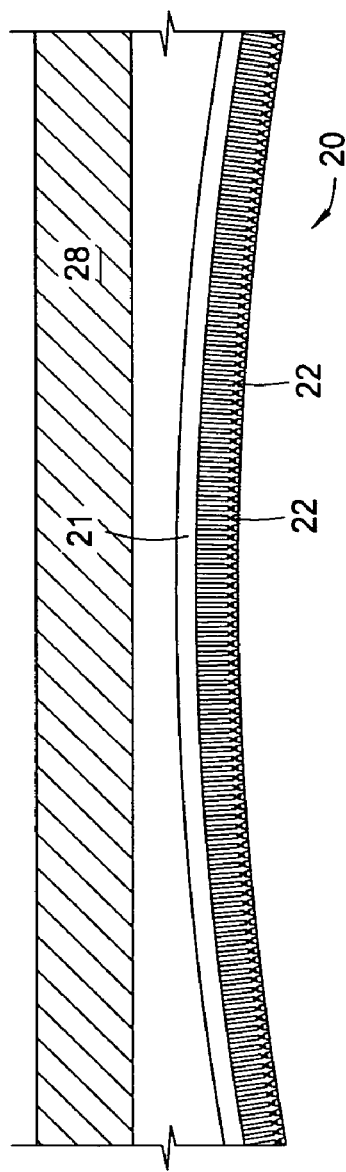
FIG. 18A is a cross sectional view of a diffuser having a concave horizontal profile.
Figure 18B:
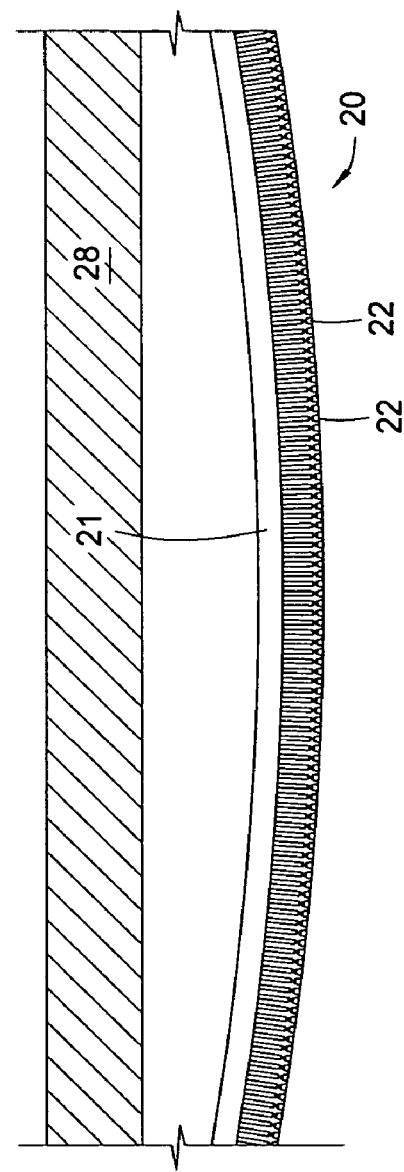
FIG. 18B is a cross sectional view of a diffuser having a convex horizontal profile.

FIG. 17C is a top view of another embodiment of a backing plate 28 that is similar to the embodiments shown in FIG. 17B with the exception of adding a plurality of threaded supports 1020 in the center area 1010. A diffuser 20, which is not shown in this view, is typically located below the backing plate 28. The diffuser 20 has dimensions substantially equal to the dimensions of backing plate 28. The diffuser 20 has a corresponding center area 1010 that may allow any of the elements depicted in this Figure to mate with the diffuser 20. Although twelve threaded supports 1020 and eight pivotal supports 1300 are shown in a symmetrical pattern in this embodiment, the plurality of threaded supports 1020 and pivotal supports 1300 may be of any pattern, number, and size in the backing plate 28. Also shown is an opening 1048 in the backing plate 28 that is adapted to receive a gas delivery system 1050 to supply a process gas or gasses to diffuser 20. In this embodiment, the diffuser will also have an appropriate coupling point formed therein to receive the gas delivery system 1050. An alternative gas passage 300 is also shown and may be used to provide process gases to the diffuser 20 alone or in combination with the opening 1048.

The diffuser 20 is adapted to perform in processing temperatures of about 350° C. to about 450° C. and, dependent upon the materials of the diffuser, portions of the diffuser 20 may exhibit expansion and contraction during a process cycle. The various parts of the pivotal support 1300 and corresponding parts of the backing plate 28 allow for this expansion or contraction by permitting lateral movement 1608 of the diffuser 20. The first bore 1328, the conical opening 1408 and the cover area 1606 allows clearance for movement of the ball stud 1302 while the expanded bore 1330 allows clearance for movement of the ball stud housing 1304. Thus, lateral movement 1608 of portions of the diffuser 20 is permitted in response to any expansion or contraction encountered by the diffuser 20. In one embodiment, the pivotal support 1300 permits movement 1608 of portions of the diffuser 20 between about 0.25 inches to about 0.5 inches.

The diffuser 20 may be prone to sagging in specific areas to deform in a downward vertical direction, but if portions of the diffuser 20 move horizontally due to expansion or contraction, the same or other portions of the diffuser 20 may move vertically due to a radial path inherent in the design of the pivotal support 1300. Any upward vertical movement may be tolled by an upper surface 1610 of the expanded bore 1330 which may act as a stop when the ball stud housing 1304 contacts the upper surface 1610. Alternatively or additionally, a threaded upper pivotal member 1306 may be coupled to the ball stud 1302.

In another embodiment, the pivotal support 1300 may be adjusted with known deformations of specific areas of the diffuser 20 in mind that anticipates lateral movement and any vertical movement facilitated by the pivotal support 1300. This embodiment describes a method of supporting a diffuser inside a chamber using a plurality of support members. Once the diffuser 20 is suspended from the backing plate 28 and the optional flexible suspension 57 at a specific height or distance above the substrate support 12 (FIG. 1), the diffuser gravitational support 15 may be adjusted to a predetermined height and locked in position as described in the description of FIGS. 5 and 6A. Based on the actual or desired distance between the substrate support and the portions of the diffuser 20 underlying the pivotal supports 1300, the pivotal supports 1300, already installed as described in the description of FIGS. 14 and 15, may need to be adjusted upward or downward by rotating the nut 1516 on the threaded portion 1310 of the ball stud 1302. When each portion of the diffuser 20 underlying each pivotal support 1300 is determined to be at a desired distance relative the substrate support 12, the nut 1516 on each threaded portion 1310 may be tightened and locked by a jam nut 1518.

The distance between the substrate support and the diffuser may be set by personnel using a gauge or gauges to set and measure multiple areas between the diffuser and substrate support. When these measurements are complete and the diffuser height above the substrate support is determined to be satisfactory by adjusting the diffuser gravitational support 15 and the nut 1516 coupled to the threaded portion 1310 of the ball stud 1302, the nut 1516 may be loosened by appropriate rotation. This loosening of the nut 1516 may cause portions suspended by the respective pivotal support 1300 to drop, thereby shortening the distance between the diffuser and the substrate support at affected points. Once the nut 1516 is loosened a predetermined amount, the jam nut 1518 may be appropriately tightened against the nut 1516 to lock the nut 1516 in place. The loosening of the nut 1516 and subsequent drop of the diffuser may be intentional to allow for known expansive or contractive deformation of portions of the diffuser. These portions, when subjected to processing conditions, may then be restricted in deformation in a downward direction by contact between the nut 1516 and the upper pivotal member 1306. The plurality of pivotal supports 1300, previously adjusted by personnel as described, may produce a horizontal profile of the diffuser that is any desired distance at any point relative to the substrate support during processing. Alternatively, the diffuser 20 may be adjusted by any other method with or without regard to the horizontal profile of the substrate support 12.

Alternatively, the loosening of specific nuts 1516 coupled to the threaded portion 1310 may not cause a drop in the diffuser 20 and the nut 1516 will not contact the upper pivotal member 1306. Once the nut 1516 is loosened a predetermined amount, the jam nut 1518 may be appropriately tightened against the nut 1516 to lock the nut 1516 in place. The diffuser 20 may now be at the same height prior to loosening of the nut 1516. The loosening of the nut 1516 may be intentional to allow for known expansive or contractive deformation of portions of the diffuser. These portions, when subjected to processing conditions, may then be allowed to deform vertically downward until the respective nut 1516 contacts the upper pivotal member 1306. The plurality of pivotal supports 1300, previously adjusted by personnel as described, may produce a horizontal profile of the diffuser that is any desired distance at any point relative to the substrate support during processing.

All of the above methods of adjusting the diffuser profile may be performed, monitored, and adjusted under vacuum conditions by capping any inlets or outlets that are not needed in order to adjust the horizontal profile of the diffuser. For instance, the gas block 17 (FIG. 1), the gas passage 300, or the opening 1048 may be sealed and, in the embodiment employing the pivotal supports 1300, the sealing block 1324 may be coupled to the backing plate 28. Any other unused openings may also be sealed and the chamber can be pumped down to a suitable pressure that may cause the backing plate 28 or portions of the diffuser 20 to sag. In one embodiment, a gauge or gauges may be used by personnel to monitor and adjust the height of the diffuser relative the substrate support at multiple points. In other embodiments, the diffuser profile may be adjusted by any method without regard to the horizontal orientation of the substrate support. Any adjustments may be performed by rotating adjusting members coupled to the diffuser such as the diffuser gravitational support 15, the threaded supports 1020, and the nuts 1516 on the pivotal supports 1300.

When all adjustments are made under vacuum or in ambient environment, and the diffuser exhibits a desired horizontal profile, or at a predetermined horizontal profile to anticipate known deformations, respective covers, such as the cover cup 1326 and the cover 16, may be coupled to the chamber. Caps and seals that had been in place to facilitate negative pressure within the chamber during adjustment may be removed and the chamber may be readied for processing.

An apparatus and a method for manipulating the cross-sectional curvature or horizontal profile of a diffuser has been described. The diffuser may be manipulated to present a horizontal profile that is one of planar, convex, or concave. The horizontal profile of the diffuser may be adjusted relative a substrate support in a chamber. Not wishing to be bound by theory, if the substrate support exhibits a planar horizontal profile and the diffuser exhibits a horizontal profile that is similar, it is believed that process gasses, such as silane and hydrogen, supplied to the processing region will deposit amorphous silicon in greater proportion on the edges of the substrate relative to deposition in the center area of the substrate. In one embodiment, the substrate support may exhibit a planar orientation and the horizontal profile of the diffuser will be adjusted to be concave relative to the planar substrate support to create a processing region below a center area of the diffuser that allows a greater volume of process gas to be introduced above the substrate. It is believed that this processing region having a greater volume of process gas will promote more uniform deposition across the large area substrate.

While the foregoing is directed to embodiments of the present invention, other and further embodiments of the invention may be devised without departing from the basic scope thereof, and the scope thereof is determined by the claims that follow.

The invention claimed is:

1. A method for depositing a thin film on a substrate, comprising:
   placing the substrate on a substrate support in a process chamber below a gas distribution plate, the gas distribution plate having a horizontal profile that is adjustable, wherein the horizontal profile is adjusted using a plurality of support members;
   flowing a process gas through a plurality of openings disposed in the gas distribution plate;
   forming a plasma between the gas distribution plate and the substrate; and
   depositing the thin film on the substrate.

2. A method for depositing a thin film on a substrate, comprising:
   placing the substrate between a gas distribution plate and a substrate support in a process chamber, the gas distribution plate having a horizontal profile that is adjustable, wherein the horizontal profile is adjusted by rotating a fastener coupled to the gas distribution plate;
   flowing a process gas through a plurality of openings disposed in the gas distribution plate;
   forming a plasma between the gas distribution plate and the substrate; and
   depositing the thin film on the substrate.

3. A method for depositing a thin film on a substrate, comprising:
   placing the substrate between a gas distribution plate and a substrate support in a process chamber, the gas distribution plate having a horizontal profile that is adjustable, wherein the horizontal profile is adjusted by rotating a plurality of support members coupled to the gas distribution plate;
   flowing a process gas through a plurality of openings disposed in the gas distribution plate;
   forming a plasma between the gas distribution plate and the substrate; and
   depositing the thin film on the substrate.

4. The method of claim 3, wherein at least one of the plurality of support members allows lateral movement of the gas distribution plate.

5. A method for depositing a thin film on a substrate, comprising:
   adjusting a horizontal profile of a gas distribution plate disposed in a process chamber, wherein the adjustment comprises rotating at least one support member coupled to a center portion of the gas distribution plate, wherein the at least one support member is configured to allow lateral movement of the gas distribution plate;
   placing the substrate on a substrate support, the substrate support disposed in a facing relationship with the gas distribution plate;
   forming a plasma between the gas distribution plate and the substrate; and
   depositing the thin film on the substrate.

6. A method for depositing a thin film on a substrate, comprising:

adjusting a horizontal profile of a gas distribution plate disposed in a process chamber, wherein the adjustment comprises rotating at least one support member coupled to a center portion of the gas distribution plate, wherein the at least one support member is configured to allow lateral movement of the gas distribution plate while substantially limiting movement of the gas distribution plate toward or away from the substrate support;

placing the substrate on a substrate support, the substrate support disposed in a facing relationship with the gas distribution plate;

forming a plasma between the gas distribution plate and the substrate; and depositing the thin film on the substrate.

7. A method for depositing a thin film on a substrate, comprising:

adjusting a horizontal profile of a gas distribution plate disposed in a process chamber, wherein the adjustment comprises:
- rotating at least one support member coupled to a center portion of the gas distribution plate; and
- moving the center portion away from the substrate support;

placing the substrate on a substrate support, the substrate support disposed in a facing relationship with the gas distribution plate;

forming a plasma between the gas distribution plate and the substrate; and depositing the thin film on the substrate.

8. A method for depositing a thin film on a substrate, comprising:

adjusting a horizontal profile of a gas distribution plate disposed in a process chamber, the gas distribution plate disposed in a facing relationship with a substrate support and having at least one support member coupled to a center portion thereof, wherein the adjusting comprises:
- rotation of the at least one support member to apply tension to the center portion; and
- locking the at least one support member;

placing a substrate on the substrate support;

forming a plasma between the gas distribution plate and the substrate; and depositing the thin film on the substrate.

9. The method of claim 8, wherein the rotation comprises rotation of a nut, a bolt, a screw, and combinations thereof.

10. The method of claim 8, wherein the locking comprises rotation of a nut, a bolt, a screw, and combinations thereof.

11. The method of claim 8, wherein the at least one support member is configured to allow lateral movement of the gas distribution plate.

12. The method of claim 8, wherein the at least one support member is configured to allow lateral movement of the gas distribution plate while substantially limiting movement of the gas distribution plate toward or away from the substrate support.

13. The method of claim 8, wherein the at least one support member is coupled by a threaded connection to the gas distribution plate.

14. The method of claim 8, wherein the at least one support member is coupled by a slot and key connection to the gas distribution plate.

15. The method of claim 8, wherein the thin film is amorphous silicon.

* * * * *

UNITED STATES PATENT AND TRADEMARK OFFICE
CERTIFICATE OF CORRECTION

PATENT NO. : 7,429,410 B2  Page 1 of 1
APPLICATION NO. : 11/188922
DATED : September 30, 2008
INVENTOR(S) : Keller et al.

It is certified that error appears in the above-identified patent and that said Letters Patent is hereby corrected as shown below:

On the Title page, Item (56), in Other Publications:

Please delete the first listing of "Korean Office Action dated Nov. 22, 2007 for Korean Patent Application No. 10-2007-0079040." and insert --Korean Office Action dated August 29, 2006 for Korean Application No. 10-2004-0108843.-- therefor.

Signed and Sealed this

Seventeenth Day of February, 2009

JOHN DOLL
*Acting Director of the United States Patent and Trademark Office*